(12) United States Patent
Nagatomo et al.

(10) Patent No.: US 12,706,587 B2
(45) Date of Patent: Aug. 11, 2026

(54) ACOUSTIC WAVE DEVICE

(71) Applicant: Murata Manufacturing Co., Ltd., Nagaokakyo (JP)

(72) Inventors: Sho Nagatomo, Nagaokakyo (JP); Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 505 days.

(21) Appl. No.: 18/118,177

(22) Filed: Mar. 7, 2023

(65) Prior Publication Data

US 2023/0208382 A1 Jun. 29, 2023

Related U.S. Application Data

(63) Continuation of application No. PCT/JP2021/032753, filed on Sep. 7, 2021.

(Continued)

(51) Int. Cl.

*H03H 9/13* (2006.01)
*H03H 9/02* (2006.01)
*H03H 9/17* (2006.01)

(52) U.S. Cl.

CPC ........ *H03H 9/132* (2013.01); *H03H 9/02228* (2013.01); *H03H 9/173* (2013.01); *H03H 9/174* (2013.01); *H03H 9/175* (2013.01)

(58) Field of Classification Search

CPC ............. H03H 9/0211; H03H 9/02031; H03H 9/02228; H03H 9/132; H03H 9/173;

(Continued)

(56) References Cited

U.S. PATENT DOCUMENTS 10,491,192 B1 11/2019 Plesski et al.
2004/0095038 A1 * 5/2004 Takase .............. H03H 9/14541 310/313 R (Continued)

FOREIGN PATENT DOCUMENTS

JP 2017224890 A 12/2017
JP 2019062441 A 4/2019

(Continued)

OTHER PUBLICATIONS

International Search Report in PCT/JP2021/032753, mailed Oct. 19, 2021, 4 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric layer made of one of lithium niobate or lithium tantalate and including first and second main surfaces, and first and second electrode fingers on the first main surface of the piezoelectric layer. The first and second electrode fingers are adjacent electrodes. When a center thickness of the piezoelectric layer in a region between the first and second electrode fingers is denoted by $t_{p1}$, and a center-to-center distance between the first and second electrode fingers is denoted by p, $t_{p1}/p$ is about 0.5 or less. When a thickness of the piezoelectric layer in a region where the first electrode finger is located is denoted by $t_{p2}$, $t_{p1}>t_{p2}$.

19 Claims, 13 Drawing Sheets

Related U.S. Application Data

(60) Provisional application No. 63/076,093, filed on Sep. 9, 2020.

(58) Field of Classification Search
CPC ........ H03H 9/174; H03H 9/175; H03H 9/176; H03H 9/02055; H03H 9/02157; H03H 9/02015
USPC ................ 310/311, 313; 333/133, 186–188, 333/193–196
See application file for complete search history.

(56) References Cited

U.S. PATENT DOCUMENTS

| | | | | |
|---|---|---|---|---|
| 2011/0241481 | A1 | 10/2011 | Kimura et al. | |
| 2016/0182007 | A1* | 6/2016 | Bhattacharjee | H03H 3/02 29/25.35 |
| 2017/0358730 | A1 | 12/2017 | Kishimoto et al. | |
| 2019/0097602 | A1 | 3/2019 | Kimura | |
| 2019/0386633 | A1* | 12/2019 | Plesski | H03H 9/54 |
| 2022/0069803 | A1 | 3/2022 | Nozoe | |

FOREIGN PATENT DOCUMENTS

| | | | |
|---|---|---|---|
| JP | 2019075704 | A | 5/2019 |
| WO | 2010070816 | A1 | 6/2010 |
| WO | 2020130128 | A1 | 6/2020 |

OTHER PUBLICATIONS

Written Opinion in PCT/JP2021/032753, mailed Oct. 19, 2021, 4 pages.

* cited by examiner

REGION OF FORMULA (2)

ψ

180
160
140
120
100
80
60
40
20
0

0 20 40 60 80 100 120 140 160 180

θ

REGION OF FORMULA (1)

REGION OF FORMULA (3)

REGION OF FORMULA (2)

ACOUSTIC WAVE DEVICE

CROSS REFERENCE TO RELATED APPLICATIONS

This application claims the benefit of priority to Provisional Application No. 63/076,093 filed on Sep. 9, 2020 and is a Continuation Application of PCT Application No. PCT/JP2021/032753 filed on Sep. 7, 2021. The entire contents of each application are hereby incorporated herein by reference.

BACKGROUND OF THE INVENTION

1. Field of the Invention

The present invention relates to acoustic wave devices.

2. Description of the Related Art

In the related art, acoustic wave devices have been widely used as, for example, filters of mobile phones. An acoustic wave device using thickness-shear mode bulk waves as disclosed in U.S. Pat. No. 10,491,192 described below has recently been proposed. This acoustic wave device includes a pair of electrodes on a piezoelectric layer. The two electrodes in the pair face each other on the piezoelectric layer and are connected to different potentials. The application of an AC voltage across the electrodes excites thickness-shear mode bulk waves.

SUMMARY OF THE INVENTION

The use of thickness-shear mode bulk waves may generate undesired waves in the pass band or outside the pass band. This may degrade the electrical characteristics of acoustic wave devices.

Preferred embodiments of the present invention provide acoustic wave devices that each suppress undesired waves.

In one broad aspect, an acoustic wave device according to a preferred embodiment of the present invention includes a piezoelectric layer made of one of lithium niobate or lithium tantalate and including first and second main surfaces, and first and second electrodes on the first main surface of the piezoelectric layer, wherein the first electrode and the second electrode are adjacent electrodes, when a center thickness of the piezoelectric layer in a region between the first electrode and the second electrode is denoted by $t_{p1}$, and a center-to-center distance between the first electrode and the second electrode is denoted by p, $t_{p1}/p$ is about 0.5 or less, and when a thickness of the piezoelectric layer in a region where the first electrode is disposed is denoted by $t_{p2}$, $t_{p1}>t_{p2}$.

In another broad aspect, an acoustic wave device according to a preferred embodiment of the present invention includes a piezoelectric layer made of one of lithium niobate or lithium tantalate and including first and second main surfaces, and first and second electrodes on the first main surface of the piezoelectric layer, and a dielectric film in a region of the first main surface of the piezoelectric layer in which no first or second electrode is located, the dielectric film extending in a lengthwise direction of the first and second electrodes, wherein the first electrode and the second electrode are adjacent electrodes, when a center thickness of the piezoelectric layer in a region between the first electrode and the second electrode is denoted by $t_{p1}$, and a center-to-center distance between the first electrode and the second electrode is denoted by p, $t_{p1}/p$ is about 0.5 or less, and when a thickness of the piezoelectric layer in a region where at least one of the first electrode and the dielectric film is disposed is denoted by $t_{p3}$, $t_{p1}>t_{p3}$.

According to preferred embodiments of the present invention, acoustic wave devices that suppress undesired waves can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be understood that the preferred embodiments in this description are illustrative only, and partial replacements or combinations of configurations can be made between different preferred embodiments.

Figure 1:
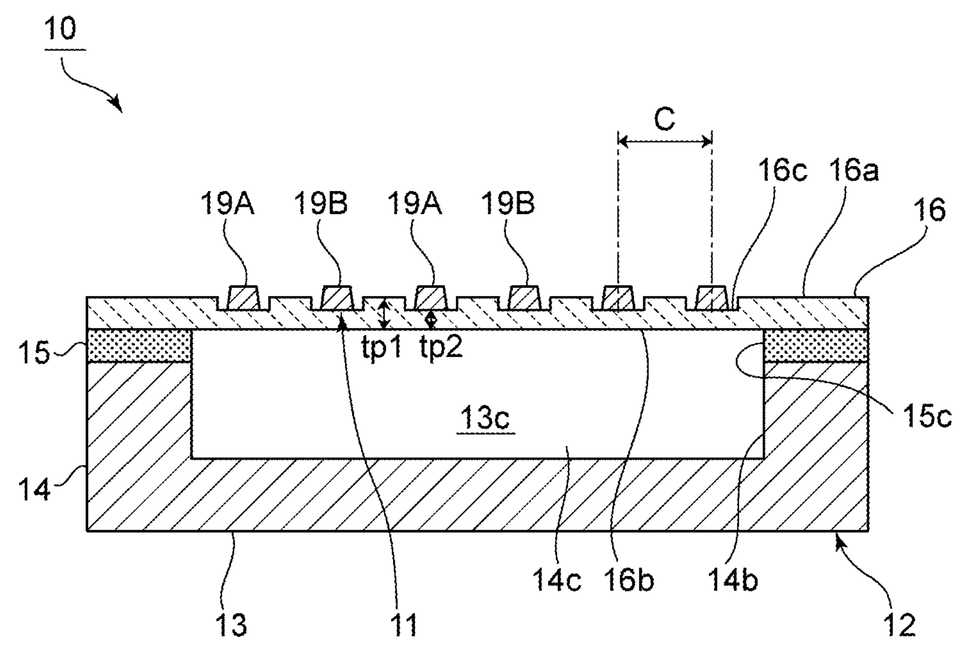
FIG. 1 is an elevational cross-sectional view of an acoustic wave device according to a first preferred embodiment of the present invention.
Figure 2:
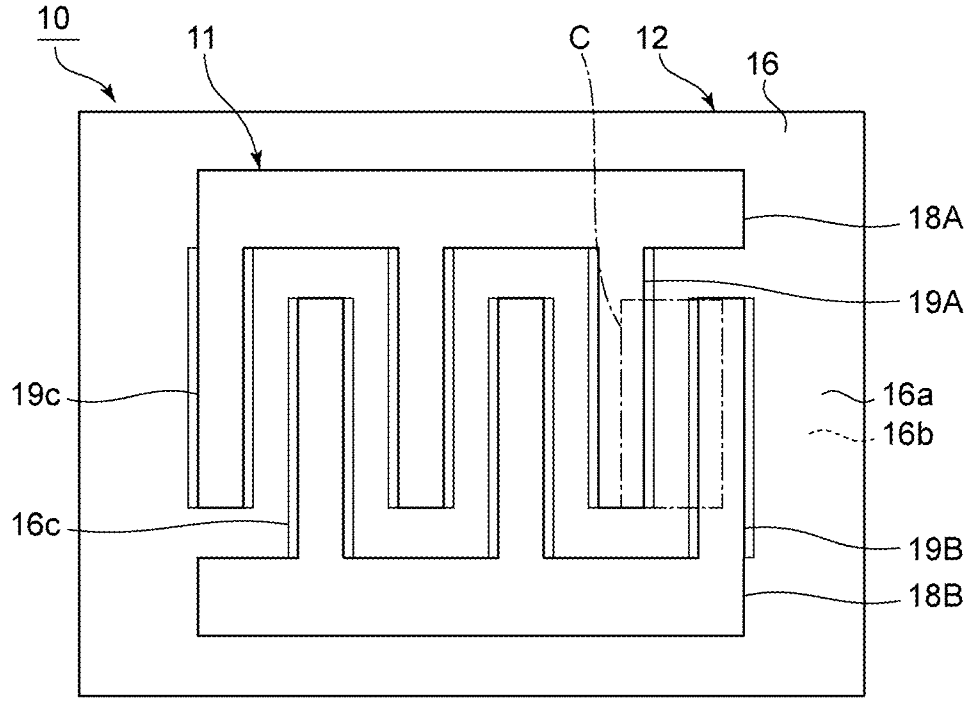
FIG. 2 is a plan view of the acoustic wave device according to the first preferred embodiment of the present invention.

FIG. 1 is a front sectional view of an acoustic wave device according to a first preferred embodiment of the present invention. FIG. 2 is a plan view of the acoustic wave device according to the first preferred embodiment.

Referring to FIG. 1, an acoustic wave device 10 includes a piezoelectric substrate 12 and an IDT electrode 11. The IDT electrode 11 is a functional electrode. The piezoelectric substrate 12 includes a support member 13 and a piezoelectric layer 16. In this preferred embodiment, the support member 13 includes a support substrate 14 and an insulating layer 15. In the piezoelectric substrate 12, the insulating layer 15 is disposed on the support substrate 14. The piezoelectric layer 16 is disposed on the insulating layer 15.

The piezoelectric layer 16 includes a first main surface **16*a* and a second main surface 16*b*. The first main surface 16*a* and the second main surface 16*b* face each other. Of the first main surface 16*a* and the second main surface 16*b*, the second main surface 16*b* is positioned adjacent to the support member 13. The piezoelectric layer 16** is made of one of lithium niobate and lithium tantalate. In this description, the expression "a member is made of a certain material" includes a case where the member contains impurities in such trace amounts that they do not degrade the electrical characteristics of the acoustic wave device.

Referring to FIG. 2, the IDT electrode 11 is disposed on the first main surface **16*a* of the piezoelectric layer 16. The IDT electrode 11 includes a first busbar 18A and a second busbar 18B, and multiple first electrode fingers 19A and multiple second electrode fingers 19B. The first busbar 18A and the second busbar 18B face each other. The first electrode fingers 19A are first electrodes. The first electrode fingers 19A are disposed periodically. The first electrode fingers 19A each have an end connected to the first busbar 18**A.

The second electrode fingers 19B are second electrodes. The second electrode fingers 19B are disposed periodically. The second electrode fingers 19B each have an end connected to the second busbar 18B. The first electrode fingers 19A are interdigitated with the second electrode fingers 19B. The first electrode fingers 19A are electrodes adjacent to the second electrode fingers 19B. In this preferred embodiment, either the first electrode fingers 19A or the second electrode fingers 19B are connected to a signal potential. The other second or first electrode fingers 19B or 19A are connected to a reference potential. Hereinafter, the first electrode fingers 19A and the second electrode fingers 19B may be referred to simply as electrode fingers.

The application of an AC voltage to the IDT electrode 11 excites acoustic waves. The acoustic wave device 10 uses, for example, thickness-shear mode bulk waves, such as thickness-shear primary mode bulk waves. The direction in which the first electrode fingers 19A face the second electrode fingers 19B is defined as an electrode finger facing direction. As viewed in the electrode finger facing direction, a region where adjacent electrode fingers overlap each other is an excitation region C. In the excitation region C, acoustic waves are excited. The excitation region C is a region between a pair of electrode fingers. More specifically, the excitation region C is a region from a center of one electrode finger in the electrode finger facing direction to a center of the other electrode finger in the electrode finger facing direction. Therefore, the IDT electrode 11 has a plurality of the excitation regions C. The thickness-shear mode bulk waves are excited in each excitation region C. In this preferred embodiment, the electrode finger facing direction is perpendicular to the lengthwise direction of the first electrode fingers 19A and the second electrode fingers 19B.

When the center thickness of the piezoelectric layer 16 in regions between the first electrode fingers 19A and the second electrode fingers 19B is denoted by $t_{p1}$, and the electrode finger pitch of the IDT electrode 11 is denoted by p, $t_{p1}/p \leq$ about 0.5, for example. The center thickness in regions between the first electrode fingers 19A and the second electrode fingers 19B corresponds to the center thickness in the excitation regions C. The electrode finger pitch is the center-to-center distance between the first electrode fingers 19A and the second electrode fingers 19B adjacent to the first electrode fingers 19A. When $t_{p1} \leq$ about 0.5, for example, the thickness-shear mode bulk waves can be excited appropriately.

Referring to FIG. 1, the first main surface **16*a* has multiple recesses 16*c*. The recesses 16*c* are disposed periodically. The first main surface 16*a* includes at least one recess 16*c***.

The first electrode fingers 19A and the second electrode fingers 19B of the IDT electrode 11 are disposed in the recesses **16*c* of the piezoelectric layer 16. More specifically, the electrode fingers are disposed in different recesses 16*c* in this preferred embodiment. The thickness of the piezoelectric layer 16 in regions where the first electrode fingers 19A are disposed is smaller than the thickness $t_{p1}$ at the center of the excitation regions C. In other words, when the thickness of the piezoelectric layer 16 in regions where the first electrode fingers 19A are disposed is denoted by $t_{p2}$, $t_{p1}>t_{p2}$. In this preferred embodiment, the thickness $t_{p2}$ is a thickness from the second main surface 16***b* of the piezoelectric layer 16 to the bottom surfaces of the recesses 16*c*.

One of the unique aspects of the present preferred embodiment is $t_{p1}/p \geq$ about 0.5 and $t_{p1}>t_{p2}$. This configuration can suppress undesired waves in the acoustic wave device 10 using thickness-shear mode bulk waves. The details of this will be described below by comparing this preferred embodiment and Comparative Example. Comparative Example differs from the first preferred embodiment in that the piezoelectric layer has no recess 16*c*.

Figure 3:
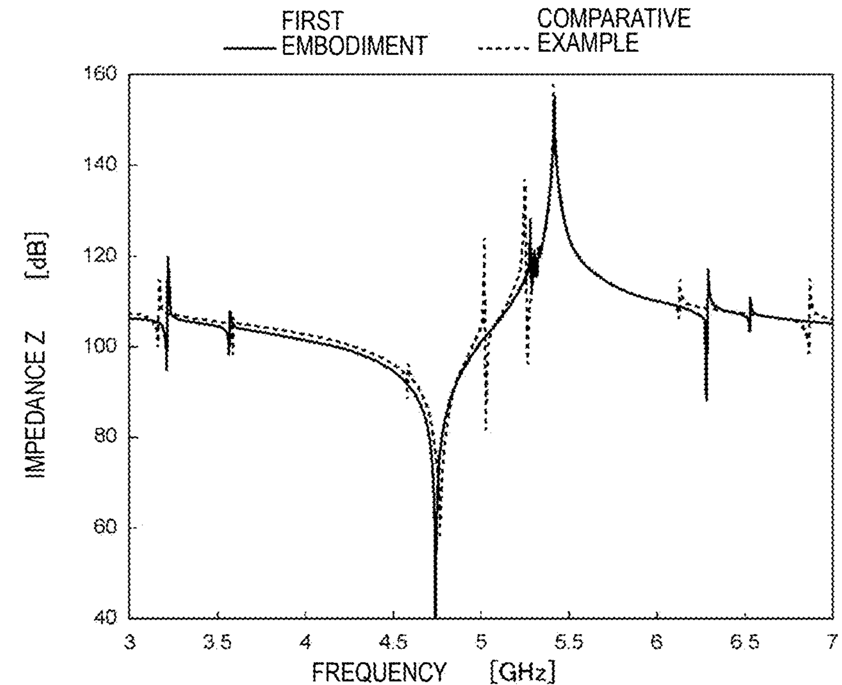
FIG. 3 illustrates impedance frequency characteristics of the acoustic wave device according to the first preferred embodiment of the present invention and an acoustic wave device according to Comparative Example.

FIG. 3 illustrates impedance frequency characteristics of the acoustic wave device according to the first preferred embodiment and an acoustic wave device according to Comparative Example. In the first preferred embodiment, the depth of the recesses 16*c* is about 60 nm, for example, when the impedance frequency characteristics in FIG. 3 are measured. The depth of each recess 16*c* in the first preferred embodiment is a dimension from the first main surface 16*a* of the piezoelectric layer 16 to the bottom surface of each recess 16*c* in the thickness direction. Hereinafter, the depth of the recesses 16*c* is denoted by $t_g$.

Referring to FIG. 3, multiple large ripples appear between the resonant frequency and the anti-resonant frequency in Comparative Example. In this preferred embodiment, ripples are unlikely to appear in the frequency characteristics, and undesired waves can be suppressed.

Figure 4A:
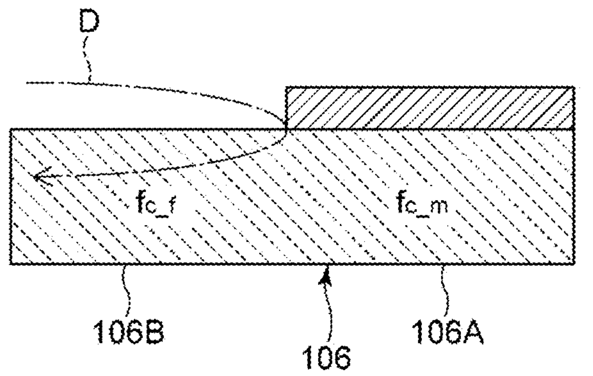
FIG. 4A is a schematic elevational cross-sectional view for describing generation of undesired waves.
Figure 4A:
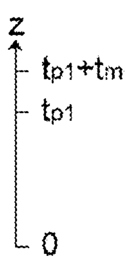
Figure 4B:
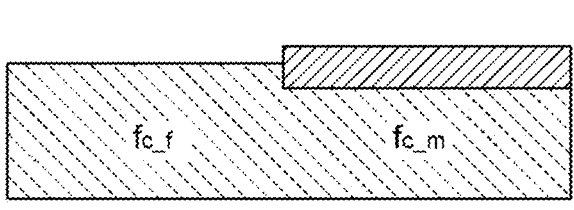
FIG. 4B is a schematic elevational cross-sectional view illustrating an example of the definition of the z-axis direction.
Figure 4B:
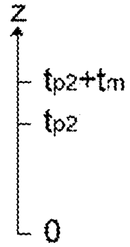

FIG. 4A is a schematic elevational cross-sectional view for describing generation of undesired waves, and FIG. 4B is a schematic elevational cross-sectional view illustrating an example of the definition of the z-axis direction.

Referring to FIG. 4A, a piezoelectric layer 106 in an acoustic wave device typically has an electrode covering portion 106A and an electrode non-covering portion 106B. The electrode covering portion 106A in FIGS. 4A and 4B is a portion of the piezoelectric layer 106 covered by an electrode, such as an electrode finger. The electrode non-covering portion 106B is a portion of the piezoelectric layer 106 not covered by an electrode. Upon excitation of the thickness-shear mode, a component, such as a Lamb wave, propagates toward the electrode fingers. Hereinafter, the component is referred to simply as a propagating component D. The studies by the inventors of preferred embodiments of the present invention reveal that the reflection of the propagating component D at the boundary between the electrode covering portion 106A and the electrode non-covering portion 106B in the piezoelectric layer 106 generates undesired waves. In this preferred embodiment, $t_{p1}>t_{p2}$. With this configuration, the reflectance of the propagating component D per electrode finger can approach 0. This configuration can prevent or reduce the reflection of the propagating component D at the boundary and can suppress undesired waves.

Figure 5:
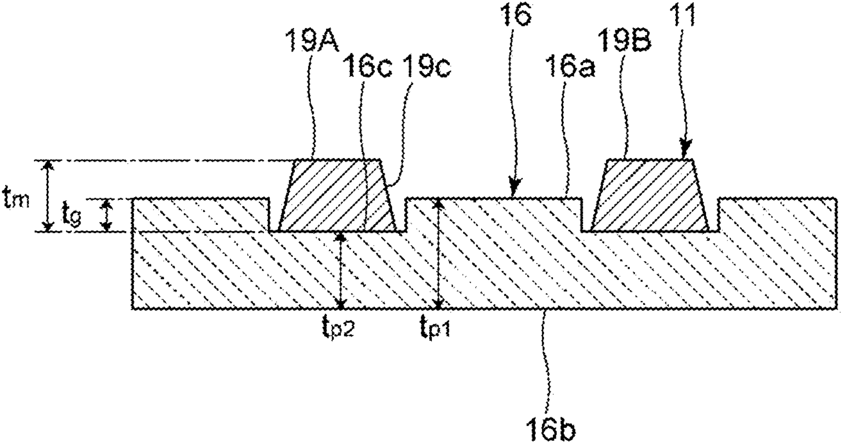
FIG. 5 is an elevational cross-sectional view of a pair of electrode fingers and the surrounding area in the first preferred embodiment of the present invention.

FIG. 5 is an elevational cross-sectional view of a pair of electrode fingers and the surrounding area in the first preferred embodiment.

When the density of the piezoelectric layer 16 is denoted by $\rho_p$, the density of the first electrode fingers 19A is denoted by $\mu_m$, the thickness of the first electrode fingers 19A is denoted by $t_m$, the acoustic velocity of transversal bulk waves propagating in the piezoelectric layer 16 is denoted by $v_{ps}$, and the acoustic velocity of transversal bulk waves propagating in the first electrode fingers 19A is denoted by $v_{ms}$, Formula (1) below is preferably satisfied. This configuration can effectively suppress undesired waves. The details of this will be described below.

Math. 1

$$\frac{t_{p2}}{t_{p1}} \geq \frac{\arctan\left(-\frac{\rho_p v_{ps}}{\rho_m v_{ms}}\tan\left(\frac{t_m v_{ps}}{t_{p1} v_{ms}}\pi\right)\right)}{\pi}. \quad \text{Formula (1)}$$

The reflectance per electrode finger is expressed as the sum of the electronic reflectance $\Gamma_e$ from piezoelectric coupling and the mechanical reflectance $\Gamma_m$ from the mass addition of the electrode finger. The electronic reflectance $\Gamma_e$ is a positive value. To obtain a reflectance per electrode finger close to 0, the mechanical reflectance $\Gamma_m$ is a negative value. To more assuredly obtain a reflectance per electrode finger close to 0, $\Gamma_m=-\Gamma_e$.

In addition, the inventors of preferred embodiments of the present invention have discovered more specific conditions for obtaining a mechanical reflectance of 0 or less. When the cutoff frequency of the thickness-shear mode in the electrode non-covering portion is denoted by $f_{c\_f}$, and the cutoff frequency of the thickness-shear mode in the electrode covering portion is denoted by $f_{c\_m}$, $f_{c\_f} \leq f_{c\_m}$ is preferably satisfied at least in a short-circuit state, that is, a state where electrical resistance is neglected. Hereinafter, what relationship should be satisfied to obtain a mechanical reflectance of 0 or less will be described in more details.

In the short-circuit state, the cutoff frequency $f_{c\_f}$ in the electrode non-covering portion is represented by Formula (2), where $t_{p1}$ is the thickness of the piezoelectric layer, and $v_{ps}$ is the acoustic velocity of transversal bulk waves propagating in the piezoelectric layer.

Math. 2

$$f_{c\_f} = \frac{V_{ps}}{2t_{p1}}. \quad \text{Formula (2)}$$

When the z-axis direction is defined as the thickness direction of the electrode covering portion as in FIG. 4B, the shear stress $T_{xz}$ at any point along the z-axis is represented by Formula (3) and Formula (4) described below. Formula (3) represents the shear stress Ixz when $0 \leq z \leq t_{p2}$. Formula (4) represents the shear stress $T_{xz}$ when $t_{p2} \leq z \leq t_{p2}+t_m$. The character A in Formula (3) and the character B in Formula (4) each represent a constant.

Math. 3

$$T_{xz} = A\sin\left(\frac{2\pi f_{cm}}{v_{ps}}z\right)(\text{when } 0 \leq z \leq t_{p2}) \quad \text{Formula (3)}$$

Math. 4

$$T_{xz} = B\sin\left(\frac{2\pi f_{cm}}{v_{ms}}(t_{p2}+t_m-z)\right)(\text{when } t_{p2} \leq z \leq t_{p2}+t_m) \quad \text{Formula (4)}$$

The boundary between the electrode finger and the piezoelectric layer is located at $z=t_{p2}$ in the z-axis direction.

Formula (5) is derived from Formula a (4) on the basis of the continuous boundary conditions of the stress and the velocity at the boundary.

Math. 5

$$\frac{\tan\left(\frac{2\pi f_{c\_m}}{v_{ps}}t_p\right)}{\tan\left(\frac{2\pi f_{c\_m}}{v_{ms}}t_m\right)} = -\frac{\rho_p v_{ps}}{\rho_m v_{ms}} \quad \text{Formula (5)}$$

The condition for $f_{c\_f}=f_{c\_m}$ can be derived from Formula (5). To derive the condition, Formula (2) when $f_{c\_f}=f_{c\_m}$ is substituted into Formula (5). More specifically, $f_{c\_m}=f_{c\_f}=v_{ps}/2t_{p1}$ is substituted into Formula (5). Formula (6) is derived accordingly.

Math. 6

$$\frac{t_{p2}}{t_{p1}} = \frac{\arctan\left(-\frac{\rho_p v_{ps}}{\rho_m v_{ms}}\tan\left(\frac{t_m v_{ps}}{t_{p1} v_{ms}}\pi\right)\right)}{\pi} \quad \text{Formula (6)}$$

To obtain a mechanical reflectance of 0 or less in order to obtain a reflectance per electrode finger close to 0, the condition to be satisfied is Formula (1).

Math. 7

$$\frac{t_{p2}}{t_{p1}} \geq \frac{\arctan\left(-\frac{\rho_p v_{ps}}{\rho_m v_{ms}}\tan\left(\frac{t_m v_{ps}}{t_{p1} v_{ms}}\pi\right)\right)}{\pi} \quad \text{Formula (7)}$$

Figure 6:
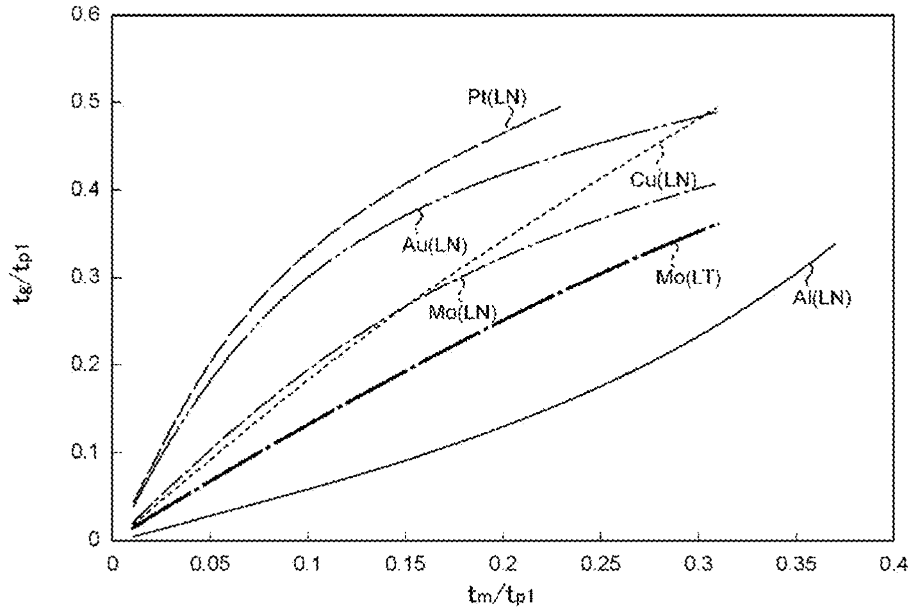
FIG. 6 illustrates the relationship between $t_m/t_{p1}$ and $t_g/t_{p1}$ when $f_{c\_f}=f_{c\_m}$ for various combinations of materials of a piezoelectric layer and electrode fingers.

The following shows that undesired waves can be further suppressed by satisfying Formula (1). The case of satisfying Formula (1) is compared with Comparative Example when different materials are used for the piezoelectric layer and the electrode fingers. More specifically, the material of the piezoelectric layer is lithium niobate (LN), and the material of the electrode fingers is Al, Cu, Mo, or Pt. In addition, the material of the piezoelectric layer is lithium tantalate (LT), and the material of the electrode fingers is Mo. FIG. 6 shows the curves corresponding to the conditions for $f_{c\_f}=f_{c\_m}$ for various combinations of materials of the piezoelectric layer and materials of the electrode fingers. FIG. 6 includes a case of using lithium niobate as a material of the piezoelectric layer and Au as a material of the electrode fingers.

FIG. 6 illustrates the relationship between $t_m/t_{p1}$ and $t_g/t_{p1}$ when $f_{c\_f}=f_{c\_m}$ for each combination of the material of the piezoelectric layer and the material of the electrode fingers.

When $t_m/t_{p1}$ and $t_g/t_{p1}$ are positioned on the curves or above the curves in FIG. 6, $f_{c\_f} \leq f_{c\_m}$ for the corresponding combinations of the materials of the piezoelectric layer and the materials of the electrode fingers. In this case, Formula (1) is satisfied. FIG. 7 to FIG. 11 illustrate the impedance frequency characteristics when Formula (1) is satisfied and in Comparative Example.

Figures 7, 8:
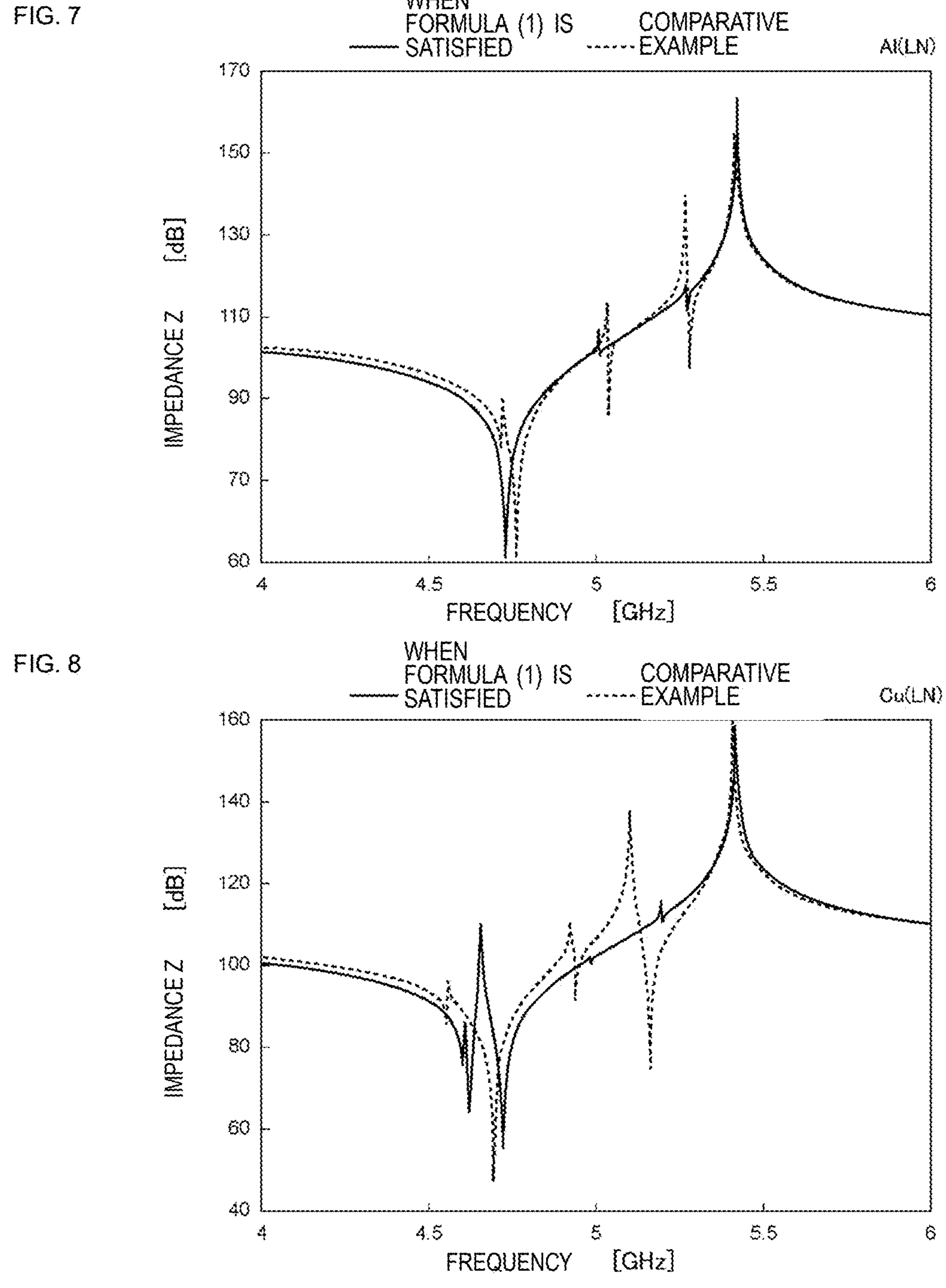
FIG. 7 illustrates impedance frequency characteristics when Formula (1) is satisfied and in Comparative Example in a case of using $LiNbO_3$ as a material of the piezoelectric layer and Al as a material of the electrode fingers.
FIG. 8 illustrates impedance frequency characteristics when Formula (1) is satisfied and in Comparative Example in a case of using $LiNbO_3$ as a material of the piezoelectric layer and Cu as a material of the electrode fingers.

FIG. 7 illustrates impedance frequency characteristics when Formula (1) is satisfied and in Comparative Example in a case of using $LiNbO_3$ as a material of the piezoelectric layer and Al as a material of the electrode fingers. The conditions for satisfying Formula (1) are $t_m/t_{p1}=0.25$ and $t_g/t_{p1}=0.2$.

FIG. 8 illustrates impedance frequency characteristics when Formula (1) is satisfied and in Comparative Example in a case of using $LiNbO_3$ as a material of the piezoelectric layer and Cu as a material of the electrode fingers. The conditions for satisfying Formula (1) are $t_m/t_{p1}=0.15$ and $t_g/tp=0.4$.

Figures 9, 10:
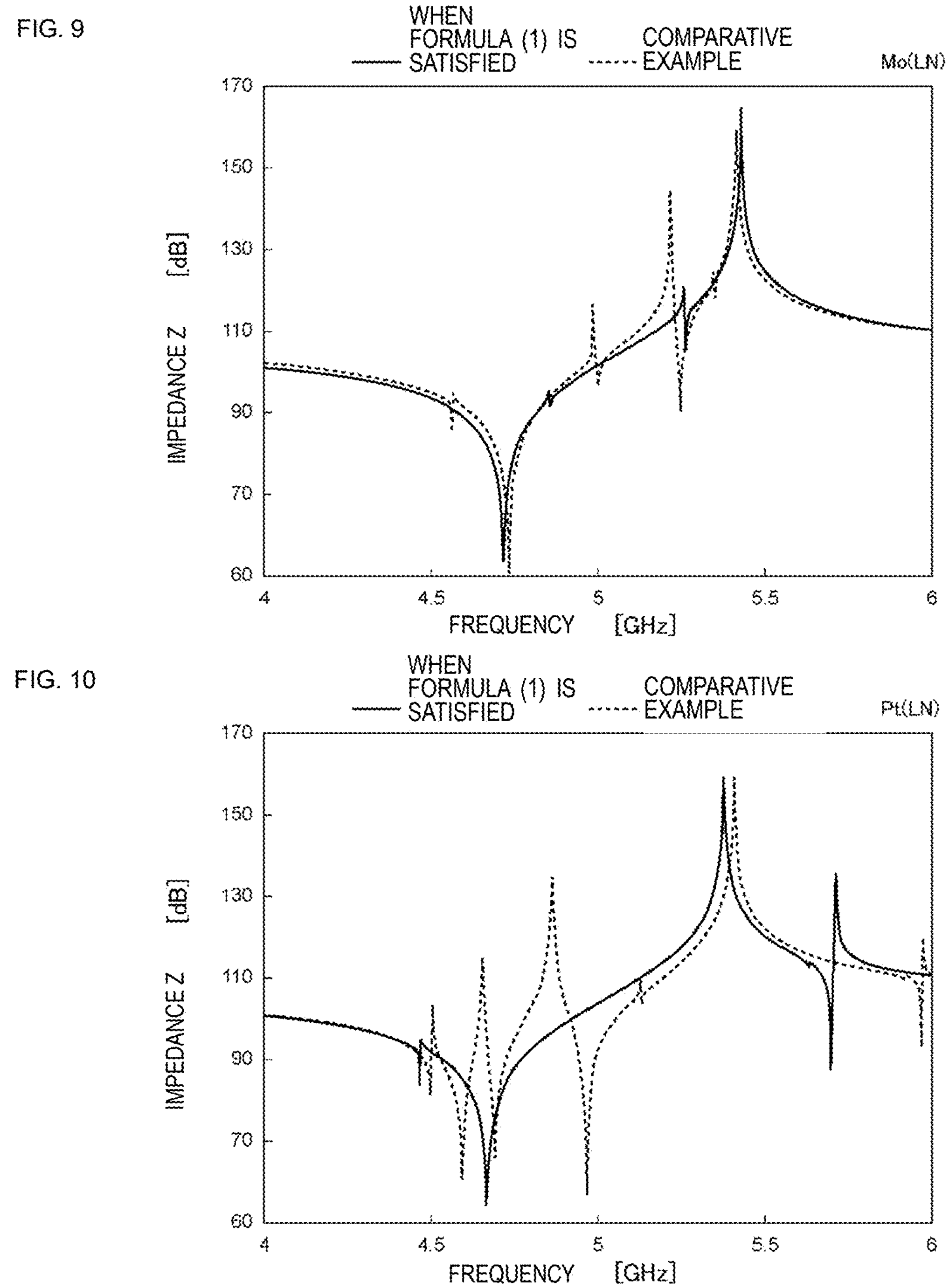
FIG. 9 illustrates impedance frequency characteristics when Formula (1) is satisfied and in Comparative Example in a case of using $LiNbO_3$ as a material of the piezoelectric layer and Mo as a material of the electrode fingers.
FIG. 10 illustrates impedance frequency characteristics when Formula (1) is satisfied and in Comparative Example in a case of using $LiNbO_3$ as a material of the piezoelectric layer and Pt as a material of the electrode fingers.

FIG. 9 illustrates impedance frequency characteristics when Formula (1) is satisfied and in Comparative Example in a case of using $LiNbO_3$ as a material of the piezoelectric layer and Mo as a material of the electrode fingers. The conditions for satisfying Formula (1) are $t_m/t_{p1}=0.15$ and $t_g/t_{p1}=0.3$.

FIG. 10 illustrates impedance frequency characteristics when Formula (1) is satisfied and in Comparative Example in a case of using $LiNbO_3$ as a material of the piezoelectric layer and Pt as a material of the electrode fingers. The conditions for satisfying Formula (1) are $t_m/t_{p1}=0.1$, and $t_g/t_{p1}=0.4$.

Figure 11:
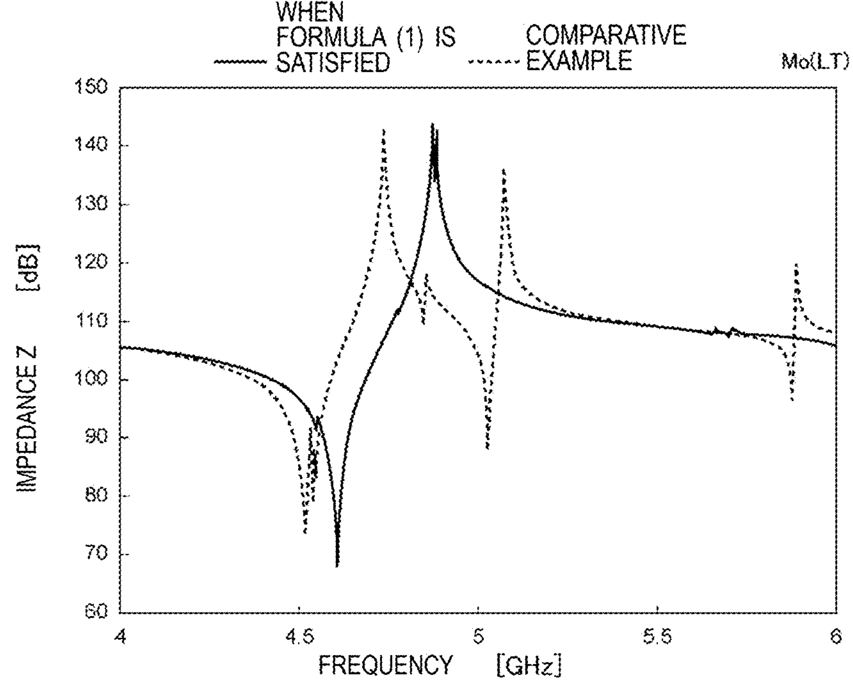
FIG. 11 illustrates impedance frequency characteristics when Formula (1) is satisfied and in Comparative Example in a case of using $LiTaO_3$ as a material of the piezoelectric layer and Mo as a material of the electrode fingers.

FIG. 11 illustrates impedance frequency characteristics when Formula (1) is satisfied and in Comparative Example in a case of using $LiTaO_3$ as a material of the piezoelectric layer and Mo as a material of the electrode fingers. The conditions for satisfying Formula (1) are $t_m/t_{p1}=0.15$ and $t_g/t_{p1}=0.25$.

FIG. 7 to FIG. 11 show that undesired waves can be effectively suppressed by satisfying Formula (1). Preferably, $t_g \leq 0.5t_{p1}$. This configuration makes it difficult to cause the fracture of the piezoelectric layer 16.

In Formula (1), the acoustic velocity $v_{ms}$ of transversal bulk waves propagating in the electrode fingers is used. The acoustic velocity $v_{ms}$ is represented by $v_{ms}=(c44/\rho)^{1/2}$, where σ is the density of the material, and c44 is an elastic constant. The acoustic velocity $v_{ml}$ of longitudinal bulk waves propagating in the electrode fingers is represented by $v_{ml}=(c11/\rho)^{1/2}$, where ρ is the density of the material, and c11 is an elastic constant. Table 1 shows examples of the material of the electrode fingers, the acoustic velocity $v_{ms}$, and the acoustic velocity $v_{ml}$. In Table 1, AlCulo is illustrated as a material of the electrode fingers. This means that the weight percent concentration of Cu in AlCu is about 1%, for example. When the weight percent concentration of Cu is other than 1%, a given constant is represented by, for example, the formula of (constant of Al)+(difference in constant between AlCu1% and Al)×n % (weight percent concentration of Cu).

TABLE 1

| Material | ρ[kg/m3] | c11[$\times 10^{10}$ Pa] | c44[$\times 10^{10}$ Pa] | $V_{ml}$[m/s] | $V_{ms}$[m/s] |
|---|---|---|---|---|---|
| Al | 2699 | 11.13 | 2.61 | 6422 | 3110 |
| AlCu1 % | 2718 | 12.14 | 2.71 | 6682 | 3160 |
| Ti | 4540 | 16.6 | 4.38 | 6049 | 3106 |
| Cu | 8960 | 18.5 | 4.50 | 4544 | 2241 |
| Mo | 10200 | 43.2 | 11.9 | 6508 | 3416 |
| Au | 19200 | 20.3 | 10.6 | 3250 | 2350 |
| Pt | 21450 | 33.5 | 6.04 | 3953 | 1678 |
| Ru | 12450 | 52.6 | 13.7 | 6503 | 3316 |
| W | 19300 | 52.6 | 16.0 | 5220 | 2880 |
| Ir | 22350 | 64.0 | 34.9 | 5350 | 3950 |

In Formula (1), the acoustic velocity $v_{ps}$ of transversal bulk waves propagating in the piezoelectric layer is used. The acoustic velocity $v_{ps}$ is represented by $v_{ms} \approx (c44/\varphi^{1/2}$, where ρ is the density of the material, and c44 is an elastic constant. The acoustic velocity $v_{p1}$ of longitudinal bulk waves propagating in the piezoelectric layer is represented by $v_{ml} \approx (c11/\rho)^{1/2}$, where ρ is the density of the material, and c11 is an elastic constant. Strictly speaking, each acoustic velocity needs to be calculated by using an elastic compliance for the material of the piezoelectric layer. Each acoustic velocity may be simply calculated as described above in the same manner as that for isotropic materials. Table 2 shows examples of the material of the piezoelectric layer, the acoustic velocity $v_{ps}$, and the acoustic velocity $v_{p1}$.

TABLE 2

| Material | ρ[kg/m3] | c11[×10$^{10}$ Pa] | c44[×10$^{10}$ Pa] | $V_{pl}$ [m/s] | $V_{ps}$ [m/s] |
|---|---|---|---|---|---|
| $LiNbO_3$ | 4640 | 20.0 | 6.00 | 6565 | 3596 |
| $LiTaO_3$ | 7454 | 23.0 | 9.68 | 5552 | 3604 |

Referring back to FIG. 1, details of components other than the piezoelectric layer 16 in the piezoelectric substrate 12 will be described. As described above, the piezoelectric substrate 12 includes the support member 13. The support member 13 is stacked on a surface of the piezoelectric layer 16 opposite to the surface having the first electrode fingers 19A and the second electrode fingers 19B thereon. Specifically, the support member 13 is stacked on the piezoelectric layer 16 so as not to overlap an area in which the first electrode fingers 19A and the second electrode fingers 19B are disposed. The support member 13 includes the support substrate 14 and the insulating layer 15.

The support substrate 14 includes a recess 14*c* and a support portion 14*b*. The support portion 14*b* surrounds the recess 14*c*. The insulating layer 15 is disposed on the support portion 14*b*. The insulating layer 15 has a frame shape. The insulating layer 15 has a through-hole 15*c*. The recess 14*c* of the support substrate 14 and the through-hole 15*c* of the insulating layer 15 define a recess 13*c* of the support member 13. The piezoelectric layer 16 is disposed to close the recess 13*c* of the support member 13. This forms a cavity. The cavity is surrounded by the recess 13*c* of the support member 13 and the piezoelectric layer 16. The cavity is accordingly provided in a region where the support member 13 is absent on the surface of the piezoelectric layer 16 opposite to the surface having the first electrode fingers 19A and the second electrode fingers 19B thereon.

The cavity may be a through-hole in the support member 13. Alternatively, the cavity is not necessarily provided in the support member 13, but the cavity may be provided in the piezoelectric layer 16. The cavity of the piezoelectric layer 16 may be, for example, a recess on the second main surface 16*b* adjacent to the support member 13 of the piezoelectric layer 16. The piezoelectric layer 16 has a portion directly disposed on the support member 13 and a portion disposed on the support member 13 with the cavity interposed therebetween. In this case, the thickness $t_{p1}$ of the piezoelectric layer is a thickness from the bottom surface of the recess on the second main surface 16*b* to the first main surface 16*a*. The thickness $t_{p2}$ of the piezoelectric layer 16 in a region where the first electrode finger 19A is disposed is a thickness from the bottom surface of the recess on the second main surface 16*b* to the bottom surfaces of the recesses 16*c* on the first main surface 16*a*.

In this preferred embodiment, the insulating layer 15 is a $SiO_2$ layer. The material of the insulating layer 15 is not limited to that described above and may be, for example, silicon oxide having a composition ratio other than $SiO_2$, silicon nitride, or tantalum oxide. The insulating layer 15 is not necessarily provided. The support member 13 may include the support substrate 14. In this case, the recess 13*c* of the support member 13 is provided only in the support substrate 14. When the insulating layer 15 is provided, the recess 13*c* may include a recess or through-hole in the insulating layer 15, and the support substrate 14 does not necessarily have a recess.

In this preferred embodiment, the support substrate 14 is a silicon substrate. The material of the support substrate 14 is not limited to that described above. Examples of the material of the support substrate 14 include piezoelectric materials, such as aluminum oxide, lithium tantalate, lithium niobate, and crystal; various ceramics, such as alumina, sapphire, silicon nitride, aluminum nitride, silicon carbide, zirconia, cordierite, mullite, steatite, and forsterite; dielectric materials, such as diamond and glass; semiconductors, such as gallium nitride; and resins.

Referring to FIG. 5, the first electrode finger 19A has a side surface 19*c*. Similarly, the second electrode finger 19B also has a side surface. In the first preferred embodiment, the side surface of each electrode finger extends at an angle with respect to the thickness direction of the electrode fingers. The side surface of each electrode finger may extend in parallel or substantially in parallel to the thickness direction of the electrode fingers.

The thickness $t_{p2}$ of the piezoelectric layer 16 in a region where the first electrode finger 19A is disposed is smaller than the thickness $t_{p1}$ at the center of the excitation region C. Preferably, the thickness $t_{p2}$ of the piezoelectric layer 16 in a region where the first electrode finger 19A is disposed and the thickness of the piezoelectric layer 16 in a region where the second electrode finger 19B is disposed are both smaller than the thickness $t_{p1}$ at the center of the excitation region C. This configuration can prevent or reduce the reflection of the propagating component D on both the first electrode finger 19A and the second electrode finger 19B. Therefore, undesired waves can further be suppressed.

In Formula (1) to Formula (6), the parameters of the first electrode finger 19A are defined, and the parameters of the second electrode finger 19B are not defined. In the first preferred embodiment, the second electrode finger 19B is also disposed in the recesses 16*c*, like the first electrode finger 19A. If Formula (1) is satisfied using each parameter of the second electrode finger 19B and the thickness of the piezoelectric layer 16 in a region where the second electrode finger 19B is disposed, the reflection of the propagating component D on the second electrode finger 19B can be prevented or reduced effectively.

Each electrode finger is not necessarily disposed on the entire bottom surface of the corresponding recess 16*c* in the piezoelectric layer 16. More specifically, each electrode finger may have a smaller width than each recess 16*c*. The width of each electrode finger is a dimension of each electrode finger in the electrode finger facing direction. Similarly, the width of each recess 16*c* is a dimension of each recess 16*c* in the electrode finger facing direction. Preferably, each electrode finger is disposed on the entire bottom surface of the corresponding recess 16*c*. With this configuration, the reflectance in areas where the electrode fingers are disposed can approach 0 more assuredly. Therefore, undesired waves can be suppressed more assuredly and effectively.

In the first preferred embodiment, the thickness $t_m$ of each electrode finger is larger than the depth $t_g$ of the recesses 16*c* of the piezoelectric layer 16. The thickness $t_m$ may be smaller than the depth $t_g$.

Referring to FIG. 2, the functional electrode is an IDT electrode 11 in the acoustic wave device 10. The functional electrode includes at least one pair of electrodes.

Hereinafter, a first modification and a second modification of the first preferred embodiment will be described. In the first modification and the second modification, undesired waves can be suppressed as in the first preferred embodiment.

Figure 12:
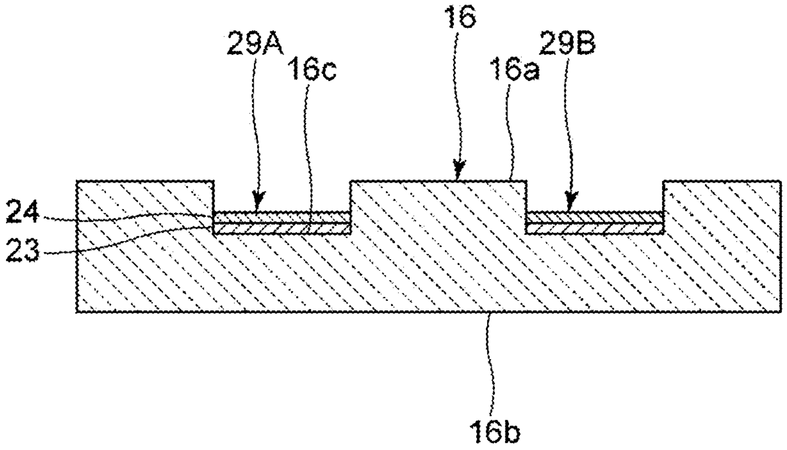
FIG. 12 is an elevational cross-sectional view of a pair of electrode fingers and the surrounding area in a first modification of the first preferred embodiment of the present invention.

In the first modification in FIG. 12, a first electrode finger 29A and a second electrode finger 29B each include a multilayer electrode film. More specifically, the first electrode finger 29A includes a first electrode film 23 and a second electrode film 24. The first electrode film 23 is disposed on the bottom surface of the recess 16*c* in the piezoelectric layer 16. The second electrode film 24 is disposed on the first electrode film 23. The same applies to the second electrode finger 29B.

In this case, the density $\rho_m$ of each electrode finger is the volume-average density of the electrode films. The acoustic velocity $v_{ms}$ of transversal bulk waves propagating in the electrode fingers may be the volume-average acoustic velocity in the electrode films.

In this modification, the first electrode finger 29A and the second electrode finger 29B are disposed on the entire bottom surfaces of the recesses 16*c* in the piezoelectric layer 16. Each electrode finger has the same width as the corresponding recess 16*c*. The side surface of each electrode finger is in contact with the inner surface of the corresponding recess 16*c*. The side surface of each electrode finger may extend in parallel or substantially in parallel to the thickness direction of the electrode fingers. The thickness $t_m$ of the first electrode finger 29A and the second electrode finger 29B is smaller than the depth $t_g$ of the recesses 16*c*. Therefore, the entire first electrode finger 29A and the entire second electrode finger 29B are disposed in the respective recesses 16*c*.

Figure 13:
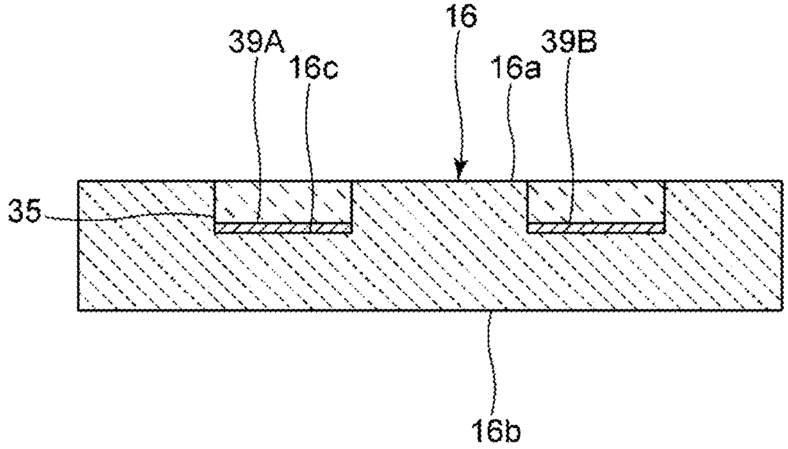
FIG. 13 is an elevational cross-sectional view of a pair of electrode fingers and the surrounding area in a second modification of the first preferred embodiment of the present invention.

In the second modification in FIG. 13, a dielectric film 35 is disposed on each of a first electrode finger 39A and a second electrode finger 39B. The first electrode finger 39A and the second electrode finger 39B are disposed in the same manner as in the first modification except that the first electrode finger 39A and the second electrode finger 39B each includes a monolayer metal film. The dielectric films 35 are disposed in the respective recesses 16*c* of the piezoelectric layer 16. The dielectric films 35 are flush with the first main surface 16*a*. More specifically, the thickness of a multilayer body including the electrode finger and the dielectric film 35 is equal or substantially equal to the depth $t_g$ of the recess 16*c*. The configuration is not limited to this. The thickness of the multilayer body may be smaller or larger than the depth $t_g$.

The material of the dielectric films 35 may be, for example, silicon oxide, silicon nitride, aluminum nitride, or tantalum oxide. More specifically, for example, $SiO_2$, SiN, AlN, or $Ta_2O_5$ can be used.

Figure 14:
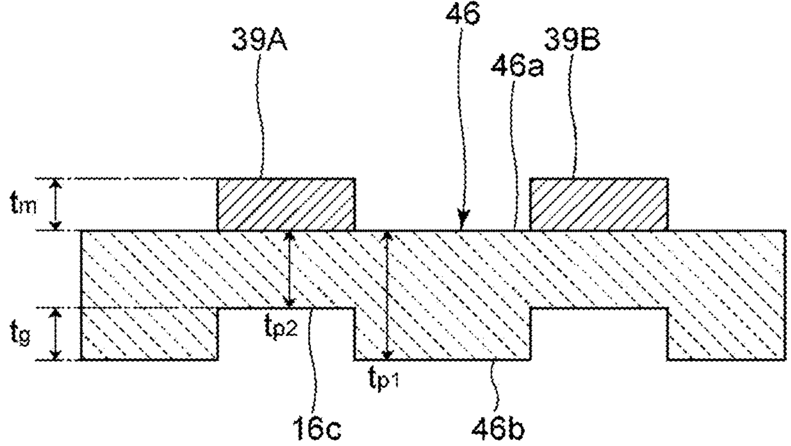
FIG. 14 is an elevational cross-sectional view of a pair of electrode fingers and the surrounding area in a second preferred embodiment of the present invention.

FIG. 14 is an elevational cross-sectional view of a pair of electrode fingers and the surrounding area in a second preferred embodiment.

This preferred embodiment differs from the first preferred embodiment in that a second main surface 46*b* of a piezoelectric layer 46 includes multiple recesses 16*c*, and a first main surface 46*a* has no recess 16*c*. No electrode fingers are provided in the recesses 16*c*. This preferred embodiment further from the first preferred embodiment in that the side surfaces of the electrode fingers extend in parallel or substantially in parallel to the thickness direction of the electrode fingers. Except for these points, an acoustic wave device of this preferred embodiment has the same structure as the acoustic wave device 10 of the first preferred embodiment.

Each recess 16*c* overlaps the corresponding electrode finger in plan view. The thickness $t_{p2}$ of the piezoelectric layer 46 in regions where the electrode fingers are disposed is smaller than the thickness $t_{p1}$ at the center of an excitation region C. In this preferred embodiment, undesired waves can be accordingly suppressed as in the first preferred embodiment. In this description, the plan view refers to a view from above in FIG. 14 and other figures. The depth $t_g$ of each recess 16*c* on the second main surface 46*b* of the piezoelectric layer 46 is a dimension from the second main surface 46*b* to the bottom surface of each recess 16*c* in the thickness direction.

In this case, Formula (1) above is preferably satisfied. This configuration can effectively suppress undesired waves.

The second main surface 46*b* of the piezoelectric layer 46 includes at least one recess 16*c*. For example, the first main surface 46*a* and the second main surface 46*b* may each include the recess 16*c*.

Figure 15:
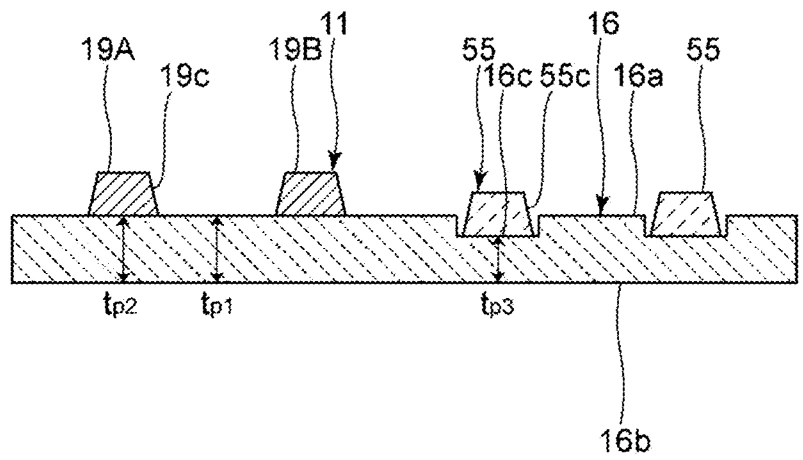
FIG. 15 is an elevational cross-sectional view of a pair of electrode fingers and the surrounding area in a third preferred embodiment of the present invention.

FIG. 15 is an elevational cross-sectional view of a pair of electrode fingers and the surrounding area in a third preferred embodiment.

This preferred embodiment differs from the first preferred embodiment in that the distance between one of two electrode fingers adjacent to a given electrode finger and the given electrode finger is different from the distance between the other electrode finger and the given electrode finger. This preferred embodiment further differs from the first preferred embodiment in that multiple dielectric films 55 are disposed in regions without any electrode fingers on a first main surface 16*a* of a piezoelectric layer 16, and in that no electrode fingers are disposed in recesses 16*c* of the piezoelectric layer 16. Except for these points, an acoustic wave device of this preferred embodiment has the same structure as the acoustic wave device 10 of the first preferred embodiment.

The dielectric films 55 extend in parallel or substantially in parallel to the lengthwise direction of the electrode fingers. The dielectric films 55 include multiple pairs of dielectric films 55. The pairs of dielectric films 55 are arranged periodically. More specifically, pairs of electrode fingers alternate with pairs of dielectric films in this preferred embodiment. Thickness-shear mode acoustic waves are excited in excitation regions C between two electrode fingers in the pairs. The structure as described above thus makes it difficult to degrade electrical characteristics. Preferably, the period of the pairs of dielectric films 55 is substantially the same as the period of the pairs of electrode fingers. Alternatively, one of the period of the pairs of dielectric films 55 and the period of the pairs of electrode fingers is preferably an integral multiple of the other period. In this case, undesired waves can be suitably suppressed. The arrangement of the dielectric films is not limited to that described above. For example, one pair of dielectric films 55 may be disposed in each excitation region C. In this case, one of two dielectric films 55 in one pair may be disposed on the first electrode finger 19A side from the center of one excitation region C. The other dielectric film 55 in the pair may be disposed on the second electrode finger 19B side from the center of the excitation region C. Alternatively, only one dielectric film 55 may be disposed between one first electrode finger 19A and the corresponding second electrode finger 19B.

In this preferred embodiment, neither the first electrode fingers 19A nor the second electrode fingers 19B are disposed in the recesses 16*c* of the piezoelectric layer 16. The thickness $t_{p2}$ of the piezoelectric layer 16 in regions where the first electrode fingers 19A are disposed is the same as the center thickness $t_{p1}$ of the excitation regions C. The dielectric films 55 are disposed in the respective recesses 16*c*. When the thickness of the piezoelectric layer 16 in regions where the dielectric films 55 are disposed is denoted by $t_{p3}$, $t_{p1}>t_{p3}$. This configuration can prevent or reduce the reflection of the propagating component D on the dielectric films 55. Therefore, undesired waves can be suppressed.

The dielectric films 55 each include a side surface 55*c*. In this preferred embodiment, the side surfaces 55*c* extend at an angle with respect to the thickness direction of the dielectric films 55. The side surfaces 55*c* may extend in parallel or substantially in parallel to the thickness direction of the dielectric films 55.

The electrical reflection of the propagating component D does not occur near the dielectric films 55. For this, the mechanical reflectance $\Gamma_m$ is preferably close to 0. Therefore, the reflection of the propagating component D on the dielectric films 55 can be effectively prevented or reduced. To obtain $\Gamma_m \approx 0$, preferably $f_{c\_f} \approx f_{c\_m}$.

The thickness of the piezoelectric layer 16 in regions where at least either the first electrode fingers 19A or the dielectric films 55 are disposed is smaller than the thickness $t_{p1}$ at the center of the excitation regions C. For example, the first electrode fingers 19A, the second electrode fingers 19B, and the dielectric films 55 may all be disposed in the respective recesses 16*c* of the piezoelectric layer 16. In this case, $t_{p1}>t_{p2}$, and $t_{p1}>t_{p3}$. Alternatively, for example, the first electrode fingers 19A may be disposed in the recesses 16*c*, and no dielectric films 55 may be disposed in the recesses 16*c*. In this case, $t_{p1}>t_{p2}$, and $t_{p1}=t_{p3}$.

In plan view, the second main surface 16*b* of the piezoelectric layer 16 may have recesses 16*c* such that the recesses 16*c* overlap at least either the first electrode fingers 19A or the dielectric films 55. In this case, the first main surface 16*a* does not necessarily have the recesses 16*c*. The first electrode fingers 19A and the dielectric films 55 are not necessarily disposed in the recesses 16*c*.

In the first to third preferred embodiments, the functional electrode is an IDI electrode. Either the first electrode fingers, serving as first electrodes, or the second electrode fingers, serving as second electrodes, provide a signal potential, and the other electrode fingers provide a reference potential. The functional electrode is not necessarily an IDT electrode. The first electrodes of the functional electrode may be floating electrodes, and the second electrodes may be electrodes connected to a signal potential. The floating electrodes refer to electrodes that are not connected to a signal potential or a reference potential. An example of this case is described in a fourth preferred embodiment.

Figure 16:
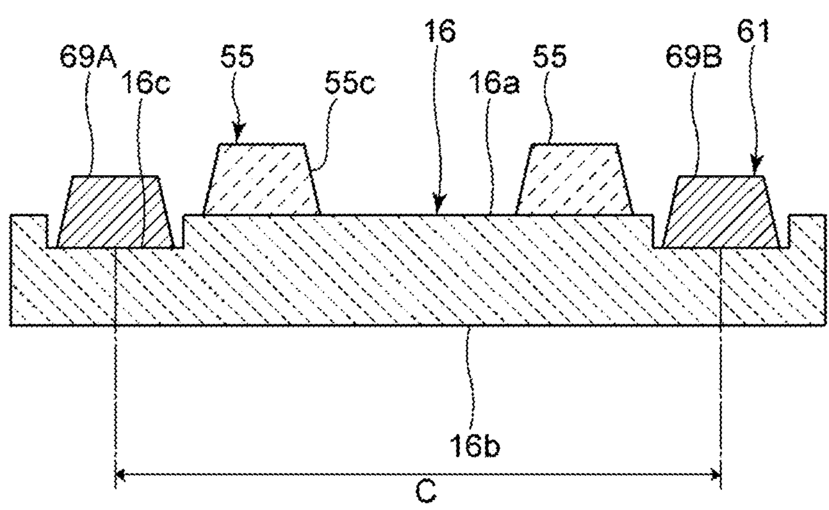
FIG. 16 is an elevational cross-sectional view of a pair of electrode fingers and the surrounding area in a fourth preferred embodiment of the present invention.

FIG. 16 is an elevational cross-sectional view of a pair of electrode fingers and the surrounding area in the fourth preferred embodiment.

This preferred embodiment differs from the first preferred embodiment in the structure of a functional electrode 61 and in that a first main surface 16*a* of a piezoelectric layer 16 has multiple dielectric films 55. Except for these points, an acoustic wave device of this preferred embodiment has the same structure as the acoustic wave device 10 of the first preferred embodiment. The dielectric films 55 are not necessarily provided.

The functional electrode 61 includes multiple pairs of a first electrode 69A and a second electrode 69B. At least one pair of the first electrode 69A and the second electrode 69B is sufficient for the functional electrode 61. The first electrode 69A is a floating electrode. The second electrode 69B is connected to a signal potential. As viewed in the direction in which the first electrode 69A and the second electrode 69B face each other, a region where the first electrode 69A and the second electrode 69B overlap each other is an excitation region C. In this preferred embodiment, the dielectric films 55 are disposed in the excitation region C.

The first electrode 69A and the second electrode 69B are disposed in the respective recesses 16*c* of the piezoelectric layer 16. The dielectric films 55 are not disposed in the recesses 16*c*. In this preferred embodiment, the reflection of the propagating component D on the first electrode 69A and the second electrode 69B can also be prevented or reduced. Therefore, undesired waves can be suppressed.

At least either the first electrode 69A or the dielectric films 55 may be disposed in the recesses 16*c*. When the dielectric films 55 are disposed in the recesses 16*c*, the reflection of the propagating component D on the dielectric films 55 can be prevented or reduced as in the third preferred embodiment.

The material of the dielectric films 55 may be, for example, silicon oxide, silicon nitride, aluminum nitride, or tantalum oxide. More specifically, for example, $SiO_2$, SiN, AlN, or $Ta_2O_5$ can be used.

The first electrode 69A is a floating electrode. In this case, Formula above is preferably satisfied. This configuration can effectively suppress undesired waves.

The details of the thickness-shear mode will be described below. An example in which a piezoelectric layer has no recess is used in the following description. The following description can also apply to cases where a piezoelectric layer has recesses as in the preferred embodiments described above. A support member in the following example corresponds to the support substrate in the present invention.

Figure 17A:
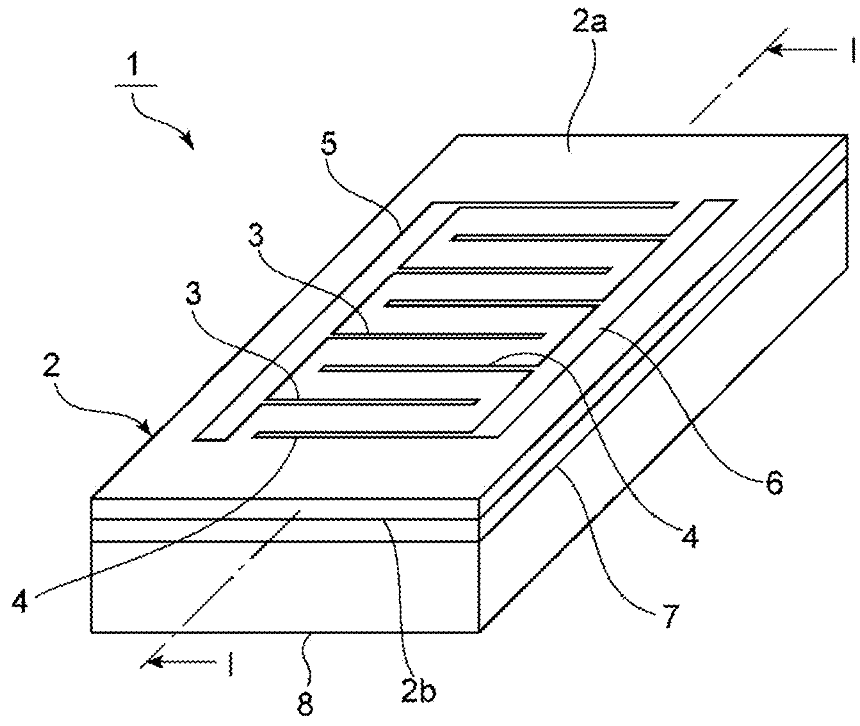
FIG. 17A is a schematic perspective view of the appearance of an acoustic wave device using thickness-shear mode bulk waves.
Figure 17B:
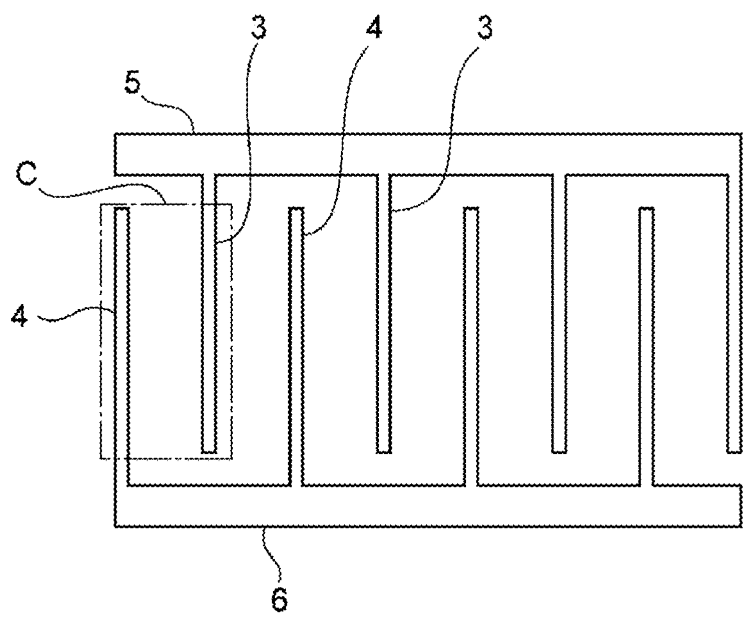
FIG. 17B is a plan view of the structure of electrodes on a piezoelectric layer.
Figure 18:
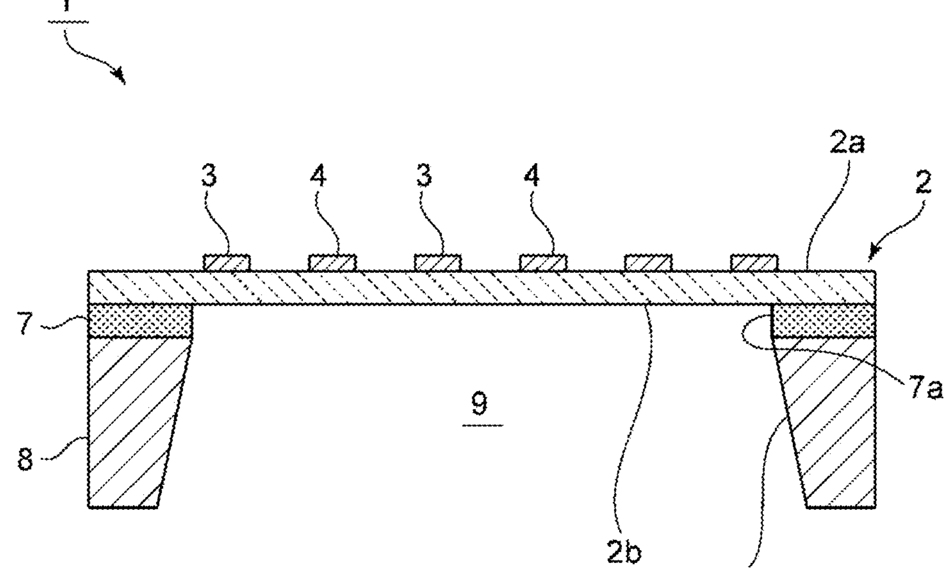
FIG. 18 is a cross-sectional view taken along line I-I in FIG. 17A.

FIG. 17A is a schematic perspective view of the appearance of an acoustic wave device using thickness-shear mode bulk waves, and FIG. 17B is a plan view of the structure of electrodes on a piezoelectric layer. FIG. 18 is a cross-sectional view taken along line I-I in FIG. 17A.

An acoustic wave device 1 has a piezoelectric layer 2 made of $LiNbO_3$. The piezoelectric layer 2 may be made of $LiTaO_3$. The cut-angle of $LiNbO_3$ or $LiTaO_3$ is a Z-cut, but may be a rotated Y-cut or X-cut. The thickness of the piezoelectric layer 2 is not limited, but preferably about 40 nm or more and about 1000 nm or less, more preferably about 50 nm or more and about 600 nm or less to effectively excite the thickness-shear mode, for example. The piezoelectric layer 2 has first and second main surfaces 2*a* and 2*b* facing each other. The first main surface 2*a* has an electrode 3 and an electrode 4 disposed thereon. The electrode 3 is an example of the “first electrode”, and the electrode 4 is an example of the “second electrode”. In FIG. 17A and FIG. 17B, a plurality of the electrodes 3 is connected to a first busbar 5. A plurality of the electrodes 4 is connected to a second busbar 6. The electrodes 3 are interdigitated with the electrodes 4. The electrodes 3 and the electrodes 4 each have a rectangular or substantially rectangular shape and have a lengthwise direction. The electrodes 3 face the adjacent electrodes 4 in the direction perpendicular to the lengthwise direction. The lengthwise direction of the electrodes 3 and 4 and the direction perpendicular to the lengthwise direction of the electrodes 3 and 4 both cross the thickness direction of the piezoelectric layer 2. In other words, the electrodes 3 face the adjacent electrodes 4 in a direction crossing the thickness direction of the piezoelectric layer 2. The lengthwise direction of the electrodes 3 and 4 may be exchanged with the direction perpendicular to the lengthwise direction of the electrodes 3 and 4 in FIGS. 17A and 17B. In other words, the electrodes 3 and 4 may extend in the direction in which the first busbar 5 and the second busbar 6 extend in FIGS. 17A and 17B. In this case, the first busbar 5 and the second busbar 6 extend in the direction in which the electrodes 3 and 4 extend in FIGS. 17A and 17B. Multiple pairs of an electrode 3 connected to one potential and the adjacent electrode 4 connected to the other potential are arranged in the direction perpendicular or substantially perpendicular to the lengthwise direction of the electrodes 3 and 4. The expression "the electrode 3 and the adjacent electrode 4" means that the electrode 3 and the electrode 4 are not disposed in direct contact with each other but disposed with a space interposed therebetween. When the electrode 3 is adjacent to the electrode 4, any electrode connected to a hot electrode or ground electrode, including other electrodes 3 and 4, is not disposed between the electrode 3 and the electrode 4. The number of pairs is not necessarily an integer, and may be 1.5 or 2.5. The center-to-center distance, that is, pitch, between the electrodes 3 and 4 is preferably in the range of about 1 μm or more and about 10 μm or less, for example. The width of the electrodes 3 and 4, that is, a dimension in the direction in which the electrodes 3 and 4 face each other, is preferably in the range of about 50 nm or more and about 1000 nm or less, more preferably in the range of about 150 nm or more and about 1000 nm or less. The center-to-center distance between the electrodes 3 and 4 is a distance connecting the center of a dimension (width dimension) of the electrode 3 in the direction perpendicular to the lengthwise direction of the electrode 3 and the center of a dimension (width dimension) of the electrode 4 in the direction perpendicular to the lengthwise direction of the electrode 4.

Since the Z-cut piezoelectric layer is used in this preferred embodiment, the direction perpendicular to the lengthwise direction of the electrodes 3 and 4 is perpendicular to the polarization direction of the piezoelectric layer 2. However, the same does not apply when a piezoelectric layer with another cut-angle is used as the piezoelectric layer 2. As used herein, the "perpendicular" is not limited to strictly perpendicular and may include substantially perpendicular (the angle between the polarization direction and the direction perpendicular to the lengthwise direction of the electrodes 3 and 4 is, for example, in the range of about 90°±10°).

A support member 8 is stacked on a second main surface 2*b* of the piezoelectric layer 2 with an insulating layer 7 interposed therebetween. The insulating layer 7 and the support member 8 each have a frame shape and have through-holes (cavities) 7*a* and 8*a* as shown in FIG. 18. This forms a cavity 9. The cavity 9 is provided to prevent interference with vibration of an excitation region C of the piezoelectric layer 2. Therefore, the support member 8 is stacked on the second main surface 2*b* with the insulating layer 7 interposed therebetween such that the support member 8 does not overlap an area in which at least one pair of electrodes 3 and 4 is disposed. The insulating layer 7 is not necessarily provided. Therefore, the support member 8 may be directly or indirectly stacked on the second main surface 2*b* of the piezoelectric layer 2.

The insulating layer 7 is made of silicon oxide. In addition to silicon oxide, an appropriate insulating material, such as silicon oxynitride or alumina, can be used. The support member 8 is made of Si. The plane orientation in the plane of Si adjacent to the piezoelectric layer 2 may be (100), (110), or (111). Silicon Si constituting the support member 8 preferably has high resistance with a resistivity of about 2 kΩ or more, more preferably has high resistance with a resistivity of about 4 kΩ or more, for example. The support member 8 may also be made of an appropriate insulating material or semiconductor material. Examples of the material of the support member 8 include piezoelectric materials, such as aluminum oxide, lithium tantalate, lithium niobate, and crystal; various ceramics, such as alumina, magnesia, sapphire, silicon nitride, aluminum nitride, silicon carbide, zirconia, cordierite, mullite, steatite, and forsterite; dielectric materials, such as diamond and glass; and semiconductors, such as gallium nitride.

The electrodes 3, the electrodes 4, and the first and second busbars 5 and 6 are made of appropriate metals or alloys, such as Al and an AlCu alloy. In this preferred embodiment, the electrodes 3 and 4 and the first and second busbars 5 and 6 each include a Ti film and an Al film on the Ti film. A close contact layer other than a Ti film may be used.

In driving, an AC voltage is applied across the electrodes 3 and the electrodes 4. More specifically, an AC voltage is applied across the first busbar 5 and the second busbar 6. This can provide resonance characteristics using thickness-shear mode bulk waves excited in the piezoelectric layer 2. When the thickness of the piezoelectric layer 2 is denoted by d, and the center-to-center distance between any adjacent electrodes 3 and 4 among multiple pairs of the electrodes 3 and 4 is denoted by p, d/p is about 0.5 or less in the acoustic wave device 1, for example. With this configuration, the thickness-shear mode bulk waves are effectively excited to provide good resonance characteristics. More preferably, d/p is about 0.24 or less, for example. In this case, better resonance characteristics can be obtained.

Since the acoustic wave device 1 has the structure described above, the Q value is less likely to decrease even when the number of pairs of the electrodes 3 and 4 is reduced for size reduction. This is because a propagation loss is small even when the number of electrode fingers in reflectors on both sides is reduced. The reason why the number of electrode fingers can be reduced is that thickness-shear mode bulk waves are used. A difference between Lamb waves and thickness-shear mode bulk waves used in an acoustic wave device will be described with reference to FIGS. 19A and 19B.

Figure 19A:
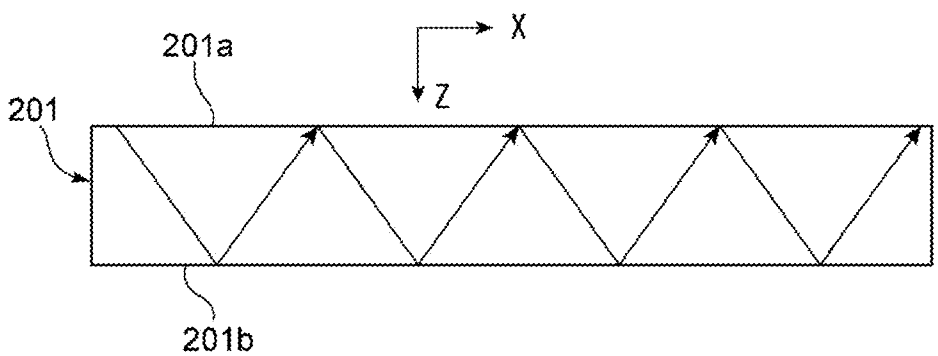
FIG. 19A is a schematic elevational cross-sectional view for describing a Lamb wave propagating in a piezoelectric layer of an acoustic wave device.

FIG. 19A is a schematic elevational cross-sectional view for describing a Lamb wave propagating in a piezoelectric film of an acoustic wave device as disclosed in U.S. Pat. No. 10,491,192. In this case, a wave propagates through a piezoelectric film 201 as indicated by arrows. In the piezoelectric film 201, a first main surface 201*a* faces a second main surface 201*b*, and the thickness direction connecting the first main surface 201*a* and the second main surface 201*b* is the Z-direction. The X-direction is a direction in which the electrode fingers of an IDT electrode are arranged. Referring to FIG. 19A, the Lamb wave propagates in the X-direction as illustrated. Since Lamb waves are plate waves, the wave propagates in the X-direction although the piezoelectric film 201 entirely vibrates, and reflectors are thus disposed on both sides to obtain resonance characteristics. This generates wave propagation loss, so that the Q value decreases when the size is reduced, that is, the number of pairs of electrode fingers is reduced.

Figure 19B:
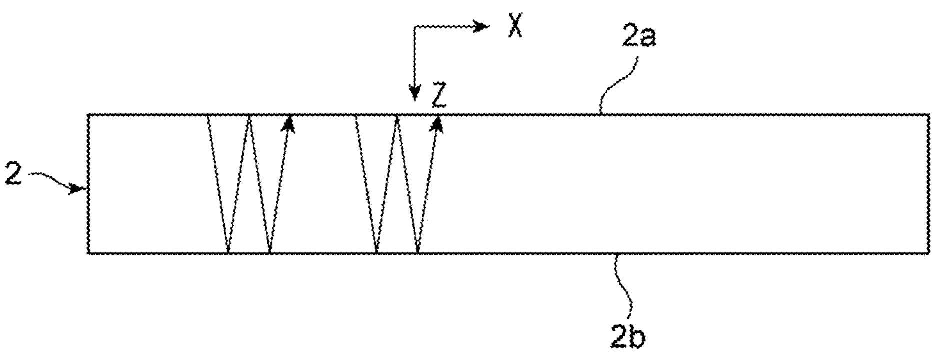
FIG. 19B is a schematic elevational cross-sectional view for describing a thickness-shear mode bulk wave propagating in a piezoelectric layer in an acoustic wave device.

Referring to FIG. 19B, the vibration displacement occurs in the thickness-shear direction in the acoustic wave device 1, and the wave thus propagates almost in the direction connecting the first main surface 2*a* and the second main surface 2*b* of the piezoelectric layer 2, that is, in the Z-direction, causing resonance. In other words, the X-direction component of the wave is significantly smaller than the Z-direction component. Since propagation of the wave in the Z-direction provides resonance characteristics, propagation loss is less likely to occur even when the number of electrode fingers in reflectors is reduced. In addition, the Q value is less likely to decrease even when the number of pairs of electrodes including the electrodes 3 and 4 is reduced for size reduction.

Figure 20:
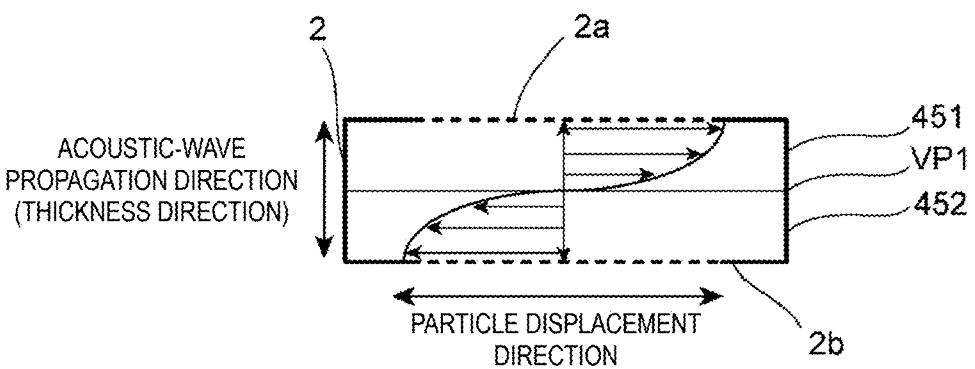
FIG. 20 illustrates the amplitude direction of thickness-shear mode bulk waves.

Referring to FIG. 20, the amplitude direction of a thickness-shear mode bulk wave in a first region 451 in the excitation region of the piezoelectric layer 2 is opposite to that in a second region 452 in the excitation region C. FIG. 20 schematically illustrates the bulk wave when a voltage is applied across the electrode 3 and the electrode 4 such that the electrode 4 has a higher potential than the electrode 3. The first region 451 is included in the excitation region C and located between the first main surface 2*a* and a virtual plane VP1 perpendicular or substantially perpendicular to the thickness direction of the piezoelectric layer 2 and dividing the piezoelectric layer 2 into two. The second region 452 is included in the excitation region C and located between the virtual plane VP1 and the second main surface 2*b*.

As described above, the acoustic wave device 1 includes at least one pair of electrodes including the electrode 3 and the electrode 4. However, the acoustic wave device 1 does not necessarily include multiple pairs of electrodes including the electrodes 3 and 4 because the wave does not propagate in the X-direction. In other words, the acoustic wave device 1 includes at least one pair of electrodes.

For example, the electrode 3 is an electrode connected to a hot potential, and the electrode 4 is an electrode connected to a ground potential. The electrode 3 may be connected to a ground potential, and the electrode 4 may be connected to a hot potential. In this preferred embodiment, at least one pair of electrodes includes an electrode conned to a hot potential or an electrode connected to a ground potential, and no floating electrode is provided, as described above.

Figure 21:
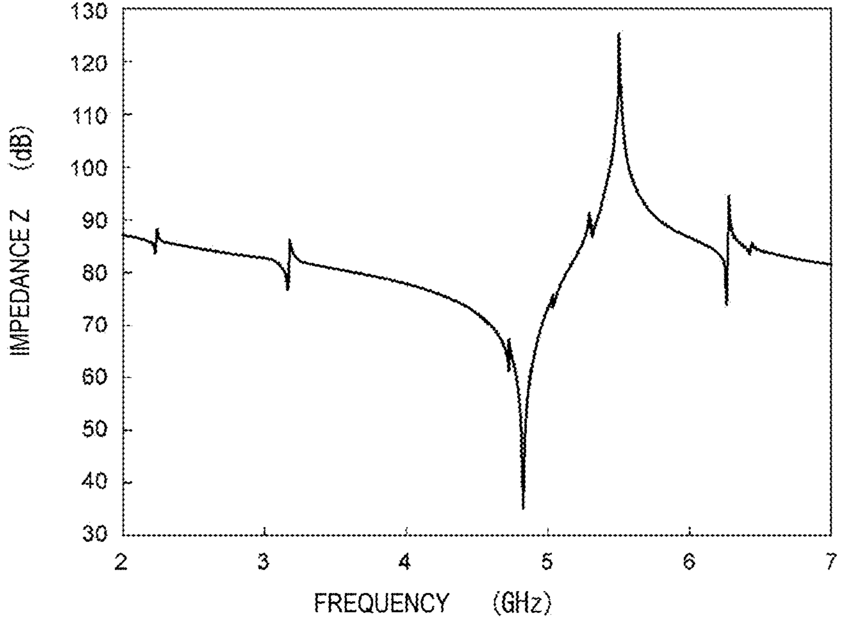
FIG. 21 illustrates the resonance characteristics of an acoustic wave device using thickness-shear mode bulk waves.

FIG. 21 illustrates the resonance characteristics of the acoustic wave device shown in FIG. 18. The design parameters of the acoustic wave device 1 having the resonance characteristics are as described below.

Piezoelectric layer 2: $LiNbO_3$ with Euler angles (0°, 0°, 90°), Thickness=400 nm When viewed in the direction perpendicular to the lengthwise direction of the electrodes 3 and the electrodes 4, the length of regions where the electrodes 3 overlap the electrodes 4, that is, the excitation regions C=about 40 μm, the number of pairs of electrodes composed of the electrodes 3 and 4=21, the center-to-center distance between the electrodes=about 3 μm, and the width of the electrodes 3 and 4=about 500 nm, and d/p=about 0.133, for example.

Insulating layer 7: a silicon oxide film with a thickness of 1 μm

Support member 8: Si

The length of each excitation region C is a dimension of each excitation region C in the lengthwise direction of the electrodes 3 and 4.

In the acoustic wave device 1, the inter-electrode distances of pairs of electrodes composed of the electrodes 3 and 4 preferably are all the same, for example. In other words, the electrodes 3 and the electrodes 4 are arranged at regular pitches.

As shown in FIG. 21, good resonance characteristics with a fractional bandwidth h of about 12.5% are obtained although reflectors are absent.

When the thickness of the piezoelectric layer 2 is denoted by d, and the center-to-center distance between the electrodes 3 and the electrodes 4 is denoted by p, d/p is about 0.5 or less, more preferably about 0.24 or less, for example, in this preferred embodiment as described above. This configuration will be described with reference to FIG. 22.

Figure 22:
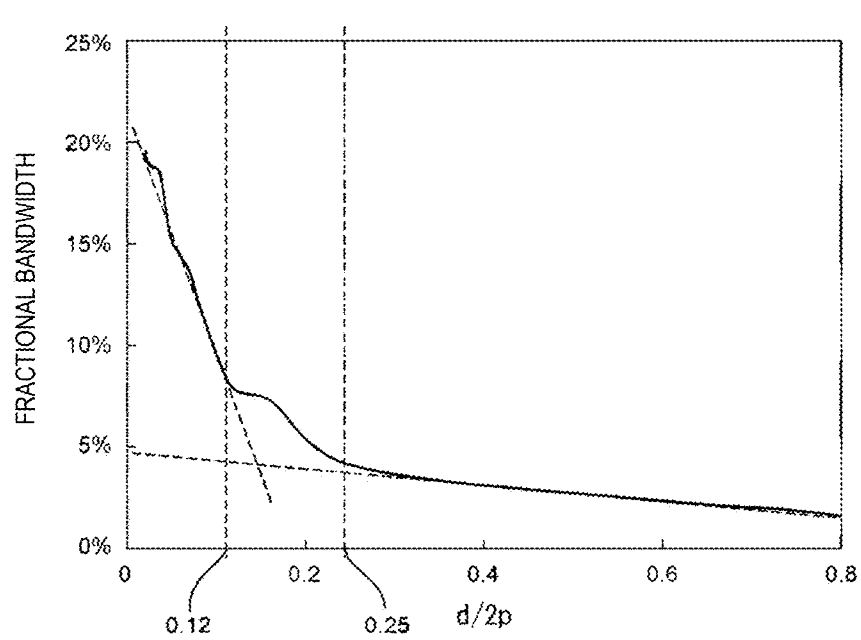
FIG. 22 illustrates the relationship between the fractional bandwidth for a resonator and d/2p, where ρ is the center-to-center distance between adjacent electrodes, and d is the thickness of a piezoelectric layer.

Acoustic wave devices with the same structure as the acoustic wave device having the resonance characteristics shown in FIG. 21 except that d/2p varies are produced. FIG. 22 illustrates the relationship between d/2p and the fractional bandwidth for a resonator of the acoustic wave device.

As shown in FIG. 22, when d/2p exceeds about 0.25, that is, d/p>about 0.5, the fractional bandwidth is less than about 5% even if d/p is adjusted. When d/2p≤about 0.25, that is, d/p≤about 0.5, the fractional bandwidth is about 5% or more, that is, a resonator having a high coupling coefficient can be formed, as long as d/p varies in this range. When d/2p is about 0.12 or less, that is, d/p is about 0.24 or less, the fractional bandwidth is as high as about 7% or more. In addition, adjusting d/p in this range can provide a resonator with a wider fractional bandwidth and can thus provide a resonator having a higher coupling coefficient. It is thus confirmed that, when d/p is about 0.5 or less, a resonator having a high coupling coefficient using the thickness-shear mode bulk waves may be formed.

As described above, p for a pair of electrodes is the center-to-center distance between adjacent electrodes 3 and 4.

The thickness d of the piezoelectric layer for the piezoelectric layer 2 having uneven thickness may be the averaged thickness.

Figure 23:
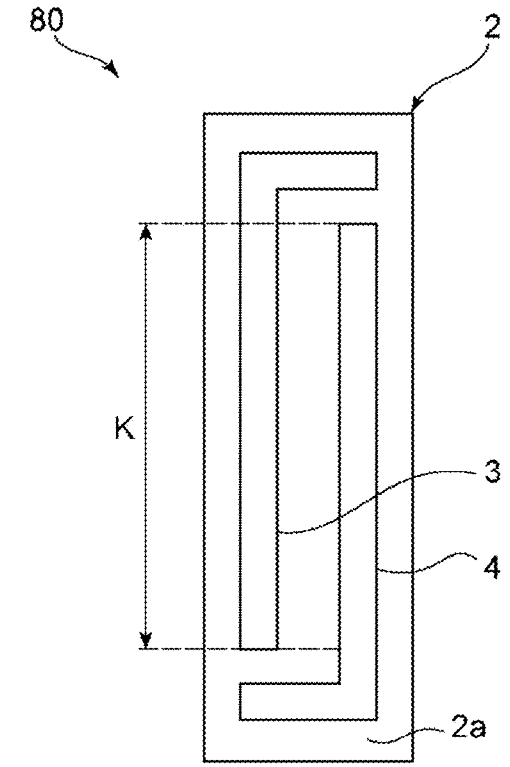
FIG. 23 is a plan view of an acoustic wave device using thickness-shear mode bulk waves.

FIG. 23 is a plan view of an acoustic wave device using thickness-shear mode bulk waves. In an acoustic wave device 80, a pair of electrodes having an electrode 3 and an electrode 4 is disposed on a first main surface 2*a* of a piezoelectric layer 2. In FIG. 23, K is the cross width. As described above, the number of pairs of electrodes may be one in the acoustic wave device of the present invention. Even in this case, the thickness-shear mode bulk waves can be excited effectively as long as d/p is about 0.5 or less, for example.

Figures 24, 25:
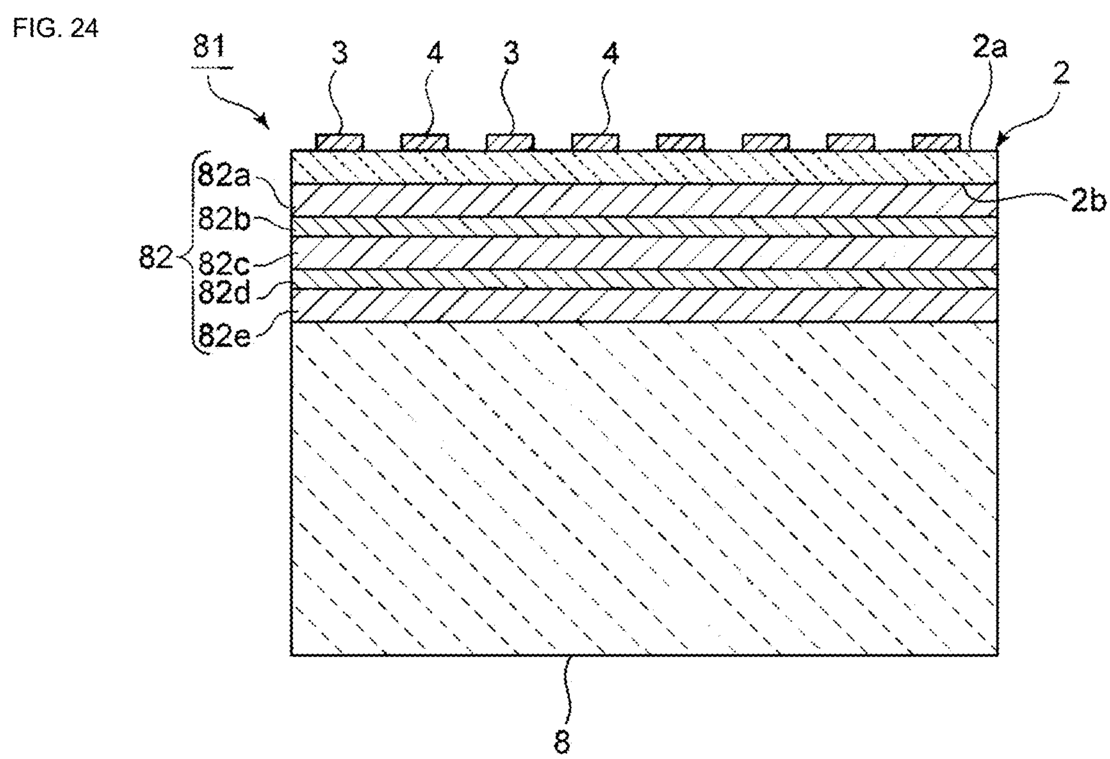
FIG. 24 is an elevational cross-sectional view of an acoustic wave device having an acoustic multilayer film.
FIG. 25 illustrates the map of the fractional bandwidth against the Euler angles (0°, θ, ψ) of $LiNbO_3$ when d/p approaches zero as close as possible.

FIG. 24 is an elevational cross-sectional view of an acoustic wave device having an acoustic multilayer film. In an acoustic wave device 81, an acoustic multilayer film 82 is stacked on a second main surface 2*b* of a piezoelectric layer 2. The acoustic multilayer film 82 has a multilayer structure including low acoustic impedance layers 82*a*, 82*c*, and 82*e* having a relatively low acoustic impedance and high acoustic impedance layers 82*b* and 82*d* having a relatively high acoustic impedance. The use of the acoustic multilayer film 82 allows thickness-shear mode bulk waves to be enclosed in the piezoelectric layer 2 without using the cavity 9 in the acoustic wave device 1. With d/p of about 0.5 or less, the acoustic wave device 81 has resonance characteristics based on the thickness-shear mode bulk waves.

The number of the low acoustic impedance layers 82*a*, 82*c*, and 82*e*, and the high acoustic impedance layers 82*b* and 82*d* stacked in the acoustic multilayer film 82 is not limited. At least one of the high acoustic impedance layers 82*b* and 82*d* is located farther away from the piezoelectric layer 2 than the low acoustic impedance layer 82*a*, 82*c*, or 82*e*.

The low acoustic impedance layers 82*a*, 82*c*, and 82*e* and the high acoustic impedance layers 82*b* and 82*d* can be made of appropriate materials as long as these acoustic impedance layers satisfy the relationship of acoustic impedance described above. Examples of the material of the low acoustic impedance layers 82*a*, 82*c*, and 82*e* include silicon oxide and silicon oxynitride. Examples of the material of the high acoustic impedance layers 82*b* and 82*d* include alumina, silicon nitride, and metals.

FIG. 25 illustrates the map of the fractional bandwidth against the Euler angles (0°, θ, ψ) of $LiNbO_3$ when d/p approaches 0 as close as possible. The hatched areas in FIG. 25 are regions with a fractional bandwidth of at least about 5% and located in the ranges represented by Formula (1), Formula (2), and Formula (3) below when the ranges of the regions are approximated.

$$(0°±10°, 0° \text{ to } 20\%, \text{any } \psi) \quad \text{Formula (1)}$$

$$(0°±10°, 20° \text{ to } 80°, 0° \text{ to } 60° (1-(\theta-50)^2/900)^{1/2}), \text{ or } (0°±10°, 20° \text{ to } 80°, [180°-60° (1-(\theta-50)^2/900)^{1/2}] \text{ to } 180°) \quad \text{Formula (2)}$$

$$(0°±10°, [180°-30°(1-(\psi-90)^2/8100)^{1/2}] \text{ to } 180°, \text{any } \psi) \quad \text{Formula (3)}$$

The range of Euler angles represented by Formula (1), Formula (2), or Formula (3) is preferred because the fractional bandwidth is sufficiently wide. The same applies when the piezoelectric layer 2 is a lithium tantalate layer.

An acoustic wave device according to a preferred embodiment of the present invention may have the acoustic multilayer film 82 shown in FIG. 24 as described above. For example, in the first preferred embodiment shown in FIG. 1 and other preferred embodiments, the acoustic multilayer film 82 may be disposed between the support substrate 14 and the piezoelectric layer 16.

While preferred embodiments of the present invention have been described above, it is to be understood that variations and modifications will be apparent to those skilled in the art without departing of the present invention. The scope of the present invention, therefore, is to be determined solely by the following claims.

What is claimed is:

1. An acoustic wave device comprising:

a piezoelectric layer made of one of lithium niobate or lithium tantalate and including first and second main surfaces; and first and second electrodes on the first main surface of the piezoelectric layer; wherein the first electrode and the second electrode are adjacent electrodes;

when a center thickness of the piezoelectric layer in a region between the first electrode and the second electrode is denoted by $t_{p1}$, and a center-to-center distance between the first electrode and the second electrode is denoted by p, $t_{p1}/p$ is about 0.5 or less;

when a thickness of the piezoelectric layer in a region where the first electrode is located is denoted by $t_{p2}$, $t_{p1}>t_{p2}$; and when a density of the piezoelectric layer is denoted by $\rho_p$, a density of the first electrode is denoted by $\rho_m$, a thickness of the first electrode is denoted by $t_m$, an acoustic velocity of a transversal bulk wave propagating in the piezoelectric layer is denoted by $v_{ps}$, and an acoustic velocity of a transversal bulk wave propagating in the first electrode is denoted by $v_{ms}$, Formula (1) below is satisfied:

$$\frac{t_{p2}}{t_{p1}} \geq \frac{\arctan\left(-\frac{\rho_p v_{ps}}{\rho_m v_{ms}} \tan\left(\frac{t_m v_{ps}}{t_{p1} v_{ms}} \pi\right)\right)}{\pi}. \quad \text{Formula (1)}$$

2. The acoustic wave device according to claim 1, wherein the first main surface of the piezoelectric layer includes at least one recess; and the first electrode is in any one of the at least one recess.

3. The acoustic wave device according to claim 1, wherein the second main surface of the piezoelectric layer includes at least one recess; and the first electrode is in a region that overlaps any one of the at least one recess in plan view.

4. The acoustic wave device according to claim 1, wherein the first electrode has a reference potential or a signal potential.

5. The acoustic wave device according to claim 2, wherein, when a dimension from the first main surface of the piezoelectric layer to a bottom surface of the recess in a thickness direction is denoted by $t_g$, $t_g \leq 0.5t_{p1}$.

6. The acoustic wave device according to claim 2, wherein the at least one recess includes a plurality of recesses; and the second electrode is in the recess different from the recess in which the first electrode is located.

7. The acoustic wave device according to claim 1, further comprising a support stacked on a surface of the piezoelectric layer opposite to a surface having the first and second electrodes thereon, the support being positioned so as not to overlap an area in which the first and second electrodes are located.

8. The acoustic wave device according to claim 7, wherein a cavity is provided in a region where the support is absent on the surface of the piezoelectric layer opposite to the surface with the first and second electrodes thereon.

9. The acoustic wave device according to claim 1, further comprising an acoustic multilayer film stacked on a surface of the piezoelectric layer opposite to a surface with the first and second electrodes thereon, wherein the acoustic multilayer film has a multilayer structure including a low acoustic impedance layer with a relatively low acoustic impedance and a high acoustic impedance layer with a relatively high acoustic impedance.

10. The acoustic wave device according to claim 1, wherein Euler angles ($\phi$, $\theta$, $\psi$) of lithium niobate or lithium tantalate of the piezoelectric layer are in a range represented by Formula (1), Formula (2), or Formula (3):

$$(0°±10°, 0° \text{ to } 20\%, \text{any } \psi) \quad \text{Formula (1).}$$

$$(0°±10°, 20° \text{ to } 80°, 0° \text{ to } 60° (1-(\theta-50)^2/900)^{1/2}), \text{ or } (0°±10°, 20° \text{ to } 80°, [180°-60° (1-(\theta-50)^2/900)^{1/2}] \text{ to } 180°) \quad \text{Formula (2)}$$

$$(0°±10°, [180°-30°(1-(\psi-90)^2/8100)^{1/2}] \text{ to } 180°, \text{any } \psi) \quad \text{Formula (3)}$$

11. An acoustic wave device comprising:

a piezoelectric layer made of one of lithium niobate or lithium tantalate and including first and second main surfaces;

first and second electrodes on the first main surface of the piezoelectric layer; and a dielectric film in a region of the first main surface of the piezoelectric layer in which no first or second electrode is provided, the dielectric film extending in a lengthwise direction of the first and second electrodes; wherein the first electrode and the second electrode are adjacent electrodes;

when a center thickness of the piezoelectric layer in a region between the first electrode and the second electrode is denoted by $t_{p1}$, and a center-to-center distance between the first electrode and the second electrode is denoted by p, $t_{p1}/p$ is about 0.5 or less;

when a thickness of the piezoelectric layer in a region where at least one of the first electrode and the dielectric film is located is denoted by $t_{p3}$, $t_{p1}>t_{p3}$; and when a density of the piezoelectric layer is denoted by $\rho_p$, a density of the first electrode is denoted by $\rho_m$, a thickness of the first electrode is denoted by $t_m$, an acoustic velocity of a transversal bulk wave propagating in the piezoelectric layer is denoted by $v_{ps}$, and an acoustic velocity of a transversal bulk wave propagating in the first electrode is denoted by $v_{ms}$, Formula (1) below is satisfied:

$$\frac{t_{p2}}{t_{p1}} \geq \frac{\arctan\left(-\frac{\rho_p v_{ps}}{\rho_m v_{ms}}\tan\left(\frac{t_m v_{ps}}{t_{p1} v_{ms}}\pi\right)\right)}{\pi}. \quad \text{Formula (1)}$$

12. The acoustic wave device according to claim 11, wherein the first main surface of the piezoelectric layer includes at least one recess; and the first electrode is in any one of the at least one recess.

13. The acoustic wave device according to claim 11, wherein the second main surface of the piezoelectric layer includes at least one recess; and the first electrode is in a region that overlaps any one of the at least one recess in plan view.

14. The acoustic wave device according to claim 11, wherein the first main surface of the piezoelectric layer includes at least one recess; and at least one of the first electrode and the dielectric film is in any one of the at least one recess.

15. The acoustic wave device according to claim 11, wherein the dielectric film, the first electrode, and the second electrode are positioned periodically.

16. The acoustic wave device according to claim 11, wherein the first electrode has a reference potential or a signal potential.

17. The acoustic wave device according to claim 11, further comprising a support stacked on a surface of the piezoelectric layer opposite to a surface having the first and second electrodes thereon, the support being positioned so as not to overlap an area in which the first and second electrodes are located.

18. The acoustic wave device according to claim 17, wherein a cavity is provided in a region where the support is absent on the surface of the piezoelectric layer opposite to the surface with the first and second electrodes thereon.

19. An acoustic wave device comprising:

a piezoelectric layer made of one of lithium niobate or lithium tantalate and including first and second main surfaces;

first and second electrodes on the first main surface of the piezoelectric layer; and a dielectric film in a region of the first main surface of the piezoelectric layer in which no first or second electrode is provided, the dielectric film extending in a lengthwise direction of the first and second electrodes; wherein the first electrode and the second electrode are adjacent electrodes;

when a center thickness of the piezoelectric layer in a region between the first electrode and the second electrode is denoted by $t_{p1}$, and a center-to-center distance between the first electrode and the second electrode is denoted by p, $t_{p1}/p$ is about 0.5 or less;

when a thickness of the piezoelectric layer in a region where at least one of the first electrode and the dielectric film is located is denoted by $t_{p3}$, $t_{p1}>t_{p3}$;

the first main surface of the piezoelectric layer includes at least one recess;

the first electrode is in any one of the at least one recess; and a width of the first electrode is less than a width of the at least one recess such that a portion of a side wall of the at least one recess is spaced apart from the first electrode.

* * * * *